US012700469B2

(12) United States Patent
Sato

(10) Patent No.: US 12,700,469 B2
(45) Date of Patent: Aug. 4, 2026

(54) MEMORY DEVICE WITH CONTROL ELEMENTS FOR UNSELECTED DEFECTIVE AND UNSELECTED NON-DEFECTIVE MEMORY BLOCKS

(71) Applicant: Kioxia Corporation, Tokyo (JP)

(72) Inventor: Manabu Sato, Chigasaki Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 113 days.

(21) Appl. No.: 18/594,066

(22) Filed: Mar. 4, 2024

(65) Prior Publication Data

US 2024/0321374 A1     Sep. 26, 2024

(30) Foreign Application Priority Data

Mar. 23, 2023     (JP) ................................. 2023-046824

(51) Int. Cl.
| | |
|---|---|
| *G11C 29/02* | (2006.01) |
| *G11C 8/12* | (2006.01) |
| *G11C 16/04* | (2006.01) |
| *G11C 16/08* | (2006.01) |
| *G11C 29/04* | (2006.01) |

(52) U.S. Cl.
CPC .............. *G11C 29/024* (2013.01); *G11C 8/12* (2013.01); *G11C 16/0433* (2013.01); *G11C 16/08* (2013.01); *G11C 29/04* (2013.01)

(58) Field of Classification Search
CPC ..... G11C 29/024; G11C 8/12; G11C 16/0433; G11C 16/08; G11C 29/04; G11C 16/26; G11C 2029/1202; G11C 16/0483; G11C 16/10
See application file for complete search history.

(56) References Cited

U.S. PATENT DOCUMENTS

| | | | |
|---|---|---|---|
| 9,449,689 B2 | 9/2016 | Hosono | |
| 10,008,276 B2 | 6/2018 | Huynh et al. | |
| 10,726,891 B1 | 7/2020 | Prakash et al. | |
| 2014/0247658 A1 | 9/2014 | Hosono | |
| 2015/0131378 A1 | 5/2015 | Hosono | |
| 2017/0316834 A1 | 11/2017 | Huynh et al. | |
| 2020/0258558 A1 | 8/2020 | Prakash et al. | |
| 2021/0295945 A1* | 9/2021 | Bassa ..................... | G11C 29/24 |
| 2022/0415398 A1* | 12/2022 | Lien ....................... | G11C 16/08 |

(Continued)

FOREIGN PATENT DOCUMENTS

JP          2014-170598 A          9/2014

*Primary Examiner* — Donald HB Braswell
(74) *Attorney, Agent, or Firm* — Foley & Lardner LLP

(57) ABSTRACT

A memory device includes a memory cell array including a block including a first transistor connected to a first select gate line, a second transistor connected to a second select gate line, and a plurality of memory cells connected in series between the first and second transistors and each connected to one corresponding word line of a plurality of word lines, and a row control circuit that outputs a control signal for setting the block to be in a selected state or an unselected state based on a result of decoding an address, stores information indicating whether the block is a non-defective block, and controls an electrical state of the second select gate line independently of the first select gate line based on the control signal and the information.

18 Claims, 17 Drawing Sheets

(56)     References Cited

U.S. PATENT DOCUMENTS

| 2023/0148408 A1* | 5/2023 | Park | G11C 11/5628 |
| | | | 365/185.22 |
| 2024/0126453 A1* | 4/2024 | Ahn | G11C 16/26 |

* cited by examiner

| Condition | | | Block decoder output | | | | | |
|---|---|---|---|---|---|---|---|---|
| | | | AROW = selected Block decoder | | | AROW = unselected Block decoder | | |
| USGS_GBFLT | RDEC | GOOD | RDECSEL | BLKSELn_D | BLKSELn_S | RDECSEL | BLKSELn_D | BLKSELn_S |
| 0 | 0 | 0 | 0 | 1 | 1 | 0 | 1 | 1 |
| 0 | 0 | 1 | 0 | 1 | 1 | 0 | 1 | 1 |
| 0 | 1 | 0 | 0 | 1 | 1 | 0 | 1 | 1 |
| 0 | 1 | 1 | 1 | 0 | 0 | 0 | 1 | 1 |
| 1 | 0 | 0 | 0 | 1 | 1 | 0 | 1 | 1 |
| 1 | 0 | 1 | 0 | 1 | 0 | 0 | 1 | 0 |
| 1 | 1 | 0 | 0 | 1 | 1 | 0 | 1 | 1 |
| 1 | 1 | 1 | 1 | 0 | 0 | 0 | 1 | 0 |

| Condition | | Block decoder output | | | | | | |
|---|---|---|---|---|---|---|---|---|
| | | AROW = selected Block decoder | | | AROW = unselected Block decoder | | | |
| RDEC | GOOD | RDECSEL | BLKSELn_D | BLKSELn_Sx | RDECSEL | BLKSELn_D | BLKSELn_Sx | |
| 0 | 0 | 0 | 1 | 1 | 0 | 1 | 1 | |
| 0 | 1 | 0 | 1 | 0 | 0 | 1 | 0 | |
| 1 | 0 | 0 | 1 | 1 | 0 | 1 | 1 | |
| 1 | 1 | 1 | 0 | 0 | 0 | 0 | 0 | |

FIG. 17

MEMORY DEVICE WITH CONTROL ELEMENTS FOR UNSELECTED DEFECTIVE AND UNSELECTED NON-DEFECTIVE MEMORY BLOCKS

CROSS-REFERENCE TO RELATED APPLICATION (S)

This application is based upon and claims the benefit of priority from Japanese Patent Application No. 2023-046824, filed Mar. 23, 2023, the entire contents of which are incorporated herein by reference.

FIELD

Embodiments described herein relate generally to a memory device.

BACKGROUND

A NAND flash memory that can store data in a non-volatile manner is known.

DESCRIPTION OF THE DRAWINGS

FIG. 5 is a circuit diagram showing a configuration example of a row control circuit of the memory device according to the first embodiment.

FIG. 6 is a circuit diagram showing a configuration example of a decode circuit of the memory device according to the first embodiment.

FIG. 8 is a diagram showing an operation example of the switch control circuit of the memory device according to the first embodiment.

FIG. 13 is a circuit diagram showing a configuration example of a memory device according to a second embodiment.

FIG. 15 is a diagram showing an operation example of the switch control circuit of the memory device according to the second embodiment.

FIG. 17 is a diagram showing a configuration example of a memory device according to a third embodiment.

DETAILED DESCRIPTION

Figure 1:
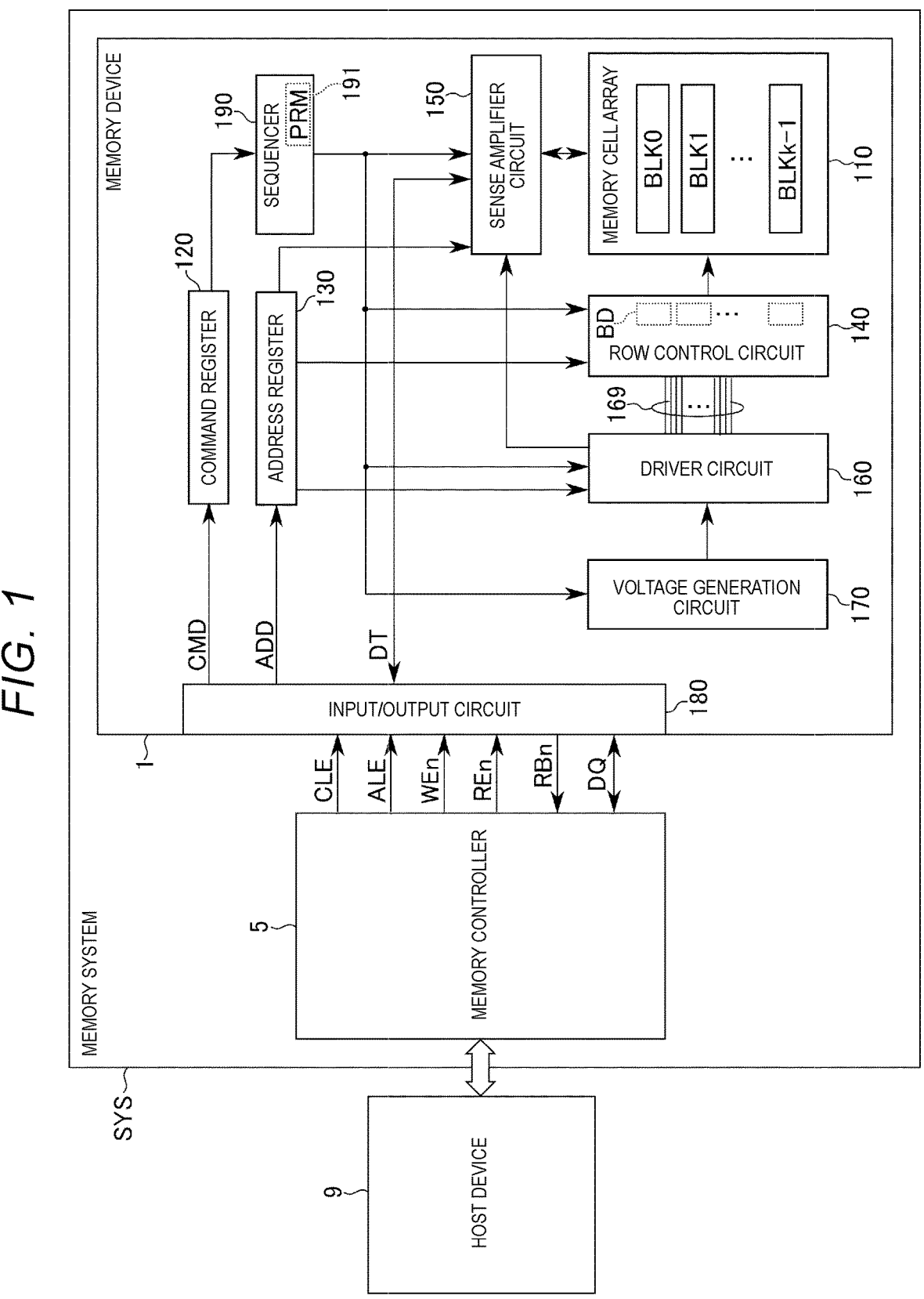
FIG. 1 is a block diagram showing a system including a memory device according to a first embodiment.

Embodiments provide improvement of the characteristics of a memory device while ensuring its yield and reliability.

In general, according to one embodiment, a memory device includes a memory cell array including a block including a first transistor connected to a first select gate line, a second transistor connected to a second select gate line, and a plurality of memory cells connected in series between the first transistor and the second transistor and each connected to one corresponding word line of a plurality of word lines, and a row control circuit that outputs a first control signal for setting the block to be in a selected state or an unselected state based on a result of decoding an address, stores information indicating whether the block is a non-defective block or a defective block, and controls an electrical state of the second select gate line independently of the first select gate line based on the first control signal and the information.

Embodiment

A memory device according to the present embodiment will be described in detail with reference to FIGS. 1 to 17. In the following description, the elements having substantially the same functions and configurations are denoted by the same reference numerals. In addition, in each of the following embodiments, when the elements (for example, a circuit, a wiring, various voltages, and various signals) denoted by reference numerals/letters for distinction at the end need not be distinguished from each other, the description (reference numerals) in which the reference numerals/letters at the end are omitted is used.

(1) First Embodiment

A memory device according to a first embodiment and a control method of the memory device will be described with reference to FIGS. 1 to 12.

(1a) Configuration Example

FIG. 1 is a block diagram showing a configuration example of a memory system SYS including a memory device 1 according to the present embodiment.

As shown in FIG. 1, the memory system SYS is connected to a host device 9 through a host bus. The memory system SYS may be requested to write data, read data, and erase data from the host device 9.

The host device 9 is, for example, a personal computer, an embedded device, or a server. The embedded device is, for example, a mobile phone or a digital camera. The host bus is, for example, a bus based on an interface standard, such as an SD™ interface, a serial attached small computer system interface (SCSI) (SAS), a serial advanced technology attachment (ATA) (SATA), a peripheral component interconnect express (PCIe), or a non-volatile memory express (NVMe). It should be noted that the memory system SYS may be connected to the host device 9 by wireless communication.

The memory system SYS includes the memory device 1 according to the present embodiment and a memory controller 5.

The memory controller 5 is electrically coupled to the memory device 1. The memory controller 5 transfers a command CMD, an address ADD, data DT, and a plurality of control signals to the memory device 1.

The memory device 1 is a non-volatile semiconductor memory device. For example, the memory device 1 according to the present embodiment is a NAND flash memory.

The memory device 1 receives the command CMD, the address ADD, the data DT, and the plurality of control signals. The data DT is transferred between the memory device 1 and the memory controller 5. Hereinafter, the data DT transferred from the memory controller 5 to the memory device 1 during a write sequence will be referred to as write data. The write data DT is written into the memory device 1. During a read sequence, the data DT transferred from memory device 1 to the memory controller 5 will be referred to as read data. The read data DT is read from the memory device 1.

The memory device 1 includes, for example, a memory cell array 110, a command register 120, an address register 130, a row control circuit 140, a sense amplifier circuit 150, a driver circuit 160, a voltage generation circuit 170, an input/output circuit 180, and a sequencer 190.

The memory cell array 110 stores data. A plurality of bit lines and a plurality of word lines are provided in the memory cell array 110. The memory cell array 110 includes a plurality of blocks BLK (BLK0, . . . , and BLKk−1). Each block BLK is an aggregate of a plurality of memory cells. Each memory cell is associated with one bit line and one word line. The memory cell array 110 includes a plurality of select gate lines for selecting a unit of control in the memory cell array 110. An internal configuration of the memory cell array 110 will be described below.

The command register 120 temporarily stores the command CMD from the memory controller 5. The command CMD is, for example, a signal including an instruction to cause the sequencer 190 to execute the read sequence, the write sequence, an erase sequence, and the like.

The address register 130 temporarily stores the address (select address) ADD from the memory controller 5. The address ADD includes, for example, a block address, a page address (word line address), and a column address. The block address, the page address, and the column address are each used for selecting the block BLK, the word line, and the bit line (column). Hereinafter, the block selected based on the block address will be referred to as a selected block. The word line selected based on the page address will be referred to as a select word line.

The row control circuit 140 controls an operation of the memory cell array 110 related to a row. The row control circuit 140 selects one block BLK in the memory cell array 110 based on the block address. The row control circuit 140 transfers, for example, a voltage applied to a wiring corresponding to the select word line to the select word line in the selected block BLK. The row control circuit 140 controls the selection (activation) and unselection (deactivation) of the select gate line based on the address ADD. The row control circuit 140 includes a plurality of block decoders BD and the like. An internal configuration of each block decoder BD will be described later.

The sense amplifier circuit 150 controls an operation of the memory cell array 110 with respect to a column. In the write sequence, the sense amplifier circuit 150 applies a voltage to each of the bit lines provided in the memory cell array 110 in accordance with the write data DT from the memory controller 5. In the read sequence, the sense amplifier circuit 150 determines the data stored in the memory cell based on the presence or absence of generation of a current in the bit line or a fluctuation of a voltage of the bit line. The sense amplifier circuit 150 transfers the data based on a determination result to the memory controller 5 as the read data DT. The sense amplifier circuit 150 includes a sense amplifier unit, a data latch circuit, a cache circuit, and the like.

The driver circuit 160 outputs a plurality of voltages used in the read sequence, the write sequence, the erase sequence, and the like to the memory cell array 110. The driver circuit 160 applies a predetermined voltage to the wirings corresponding to the word line, the bit line, and the like, based on the address ADD in the address register 130. For example, the driver circuit 160 is connected to the row control circuit 140 through a wiring group 169 including a plurality of wirings.

The voltage generation circuit 170 generates the plurality of voltages for various operations of the memory device 1. The voltage generation circuit 170 outputs the generated voltage to the driver circuit 160.

The input/output circuit 180 functions as an interface circuit on the memory device 1 side between the memory device 1 and the memory controller 5. When the memory device 1 is a NAND flash memory, the input/output circuit 180 communicates with the memory controller 5 based on a NAND interface standard, such as an Open NAND flash interface (ONFI). A command latch enable signal CLE, an address latch enable signal ALE, a write enable signal WEn, a read enable signal REn, a ready busy signal RBn, an input/output signal DQ, and the like are used for communication between the memory device 1 and the memory controller 5.

The command latch enable signal CLE is a signal indicating that the input/output signal DQ received by the memory device 1 is the command CMD. The address latch enable signal ALE is a signal indicating that the signal DQ received by the memory device 1 is the address ADD. The write enable signal WEn is a signal for giving an instruction for the input of the input/output signal DQ to the memory device 1. The read enable signal REn is a signal for giving an instruction for the output of the input/output signal DQ to the memory device 1.

The ready busy signal RBn is a signal for the memory device 1 to notify the memory controller 5 whether the memory device 1 is in a ready state in which the memory device 1 receives an instruction from the memory controller 5 or in a busy state in which the memory device 1 does not receive the instruction.

The input/output signal DQ is, for example, a signal set having an 8-bit width. The input/output signal DQ may include the command CMD, the address ADD, the data DT, and the like.

The sequencer 190 controls an entire operation of the memory device 1. The sequencer 190 controls each circuit based on the command CMD in the command register 120. For example, the sequencer 190 stores a parameter PRM for controlling the operation of the memory device 1 in the register 191. The parameter PRM is read from a read only memory (ROM) block in the memory device 1 into the register 191 in the sequencer 190 when the power of the memory device 1 (and the memory system SYS) is turned on. The parameter PRM may be supplied from the memory controller 5 to the memory device 1.

(1a-1) Memory Cell Array

Figure 2:
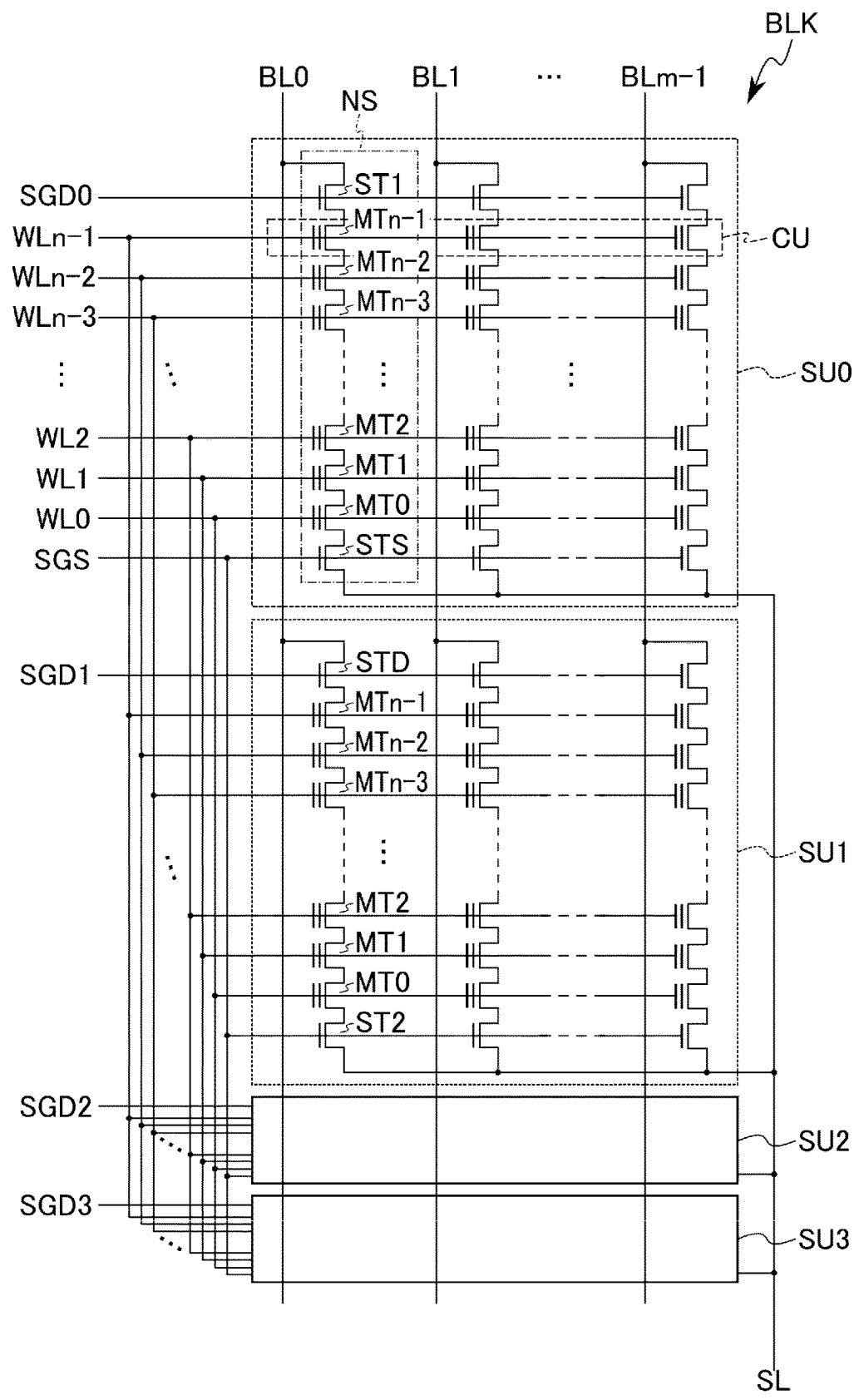
FIG. 2 is a circuit diagram showing a configuration example of a memory cell array of the memory device according to the first embodiment.

FIG. 2 is a circuit diagram showing a circuit configuration of a certain one block BLK in the memory cell array 110 in the memory device 1 according to the present embodiment.

As shown in FIG. 2, when the memory device 1 is a NAND flash memory, one block BLK includes a plurality of (for example, four) string units SU (SU0, . . . , and SU3). Each string unit SU includes a plurality of NAND strings NS. The number of blocks in the memory cell array 110, the number of string units in the block BLK, and the number of NAND strings in the string unit SU are random.

Each NAND string NS includes a plurality of memory cells MT (MT0, MT1, MT2, . . . , MTn−3, MTn−2, and MTn−1) and a plurality of select transistors ST1 and ST2. n is a natural number of 2 or more. The plurality of memory cells MT are connected in series between a source of the select transistor ST1 and a drain of the select transistor ST2.

The memory cell (also referred to as a memory cell transistor) MT is a field effect transistor having a control gate and a charge storage layer. The memory cell MT stores substantially non-volatile data having 1 bit or more. Hereinafter, an example will be described in which the memory cell MT stores 2-bit data.

The gate of the select transistor ST1 in each of the stringing units SU0 to SU3 is connected to a corresponding drain-side select gate line SGD among a plurality of drain-side select gate lines SGD (SGD0 to SGD3).

The gate of the select transistor ST2 in each of the stringing units SU0, . . . , and SU3 is commonly connected to, for example, a source-side select gate line SGS. The gate of the select transistor ST2 may be connected to the source-side select gate line SGS different for each of the string units SU0, and SU3.

The control gates of the memory cells MT0 to MTn−1 belonging to the same block BLK are each connected to one corresponding word line WL among a plurality of word lines WL (WL0, WL1, WL2, . . . , WLn−3, WLn−2, and WLn−1).

The drain of the select transistor ST1 of the NAND string NS in the memory cell array 110 belonging to the same column is connected to one corresponding bit line BL among a plurality of bit lines BL (BL0, BL1, . . . , BLm−1). M is a natural number of 2 or more.

The sources of a plurality of select transistors ST2 are commonly connected to a source line SL.

The string unit SU is an aggregate of the NAND strings NS connected to different bit lines BL and connected to the same drain-side select gate line SGD. The block BLK is an aggregate of a plurality of string units SU sharing the plurality of word lines WL. The memory cell array 110 is an aggregate of the plurality of blocks BLK that share the plurality of bit lines BL.

Hereinafter, an aggregate of the memory cells MT (memory cell group) connected to the same word line WL in the string unit SU will be also referred to as a cell unit CU (or memory group).

Figure 3:
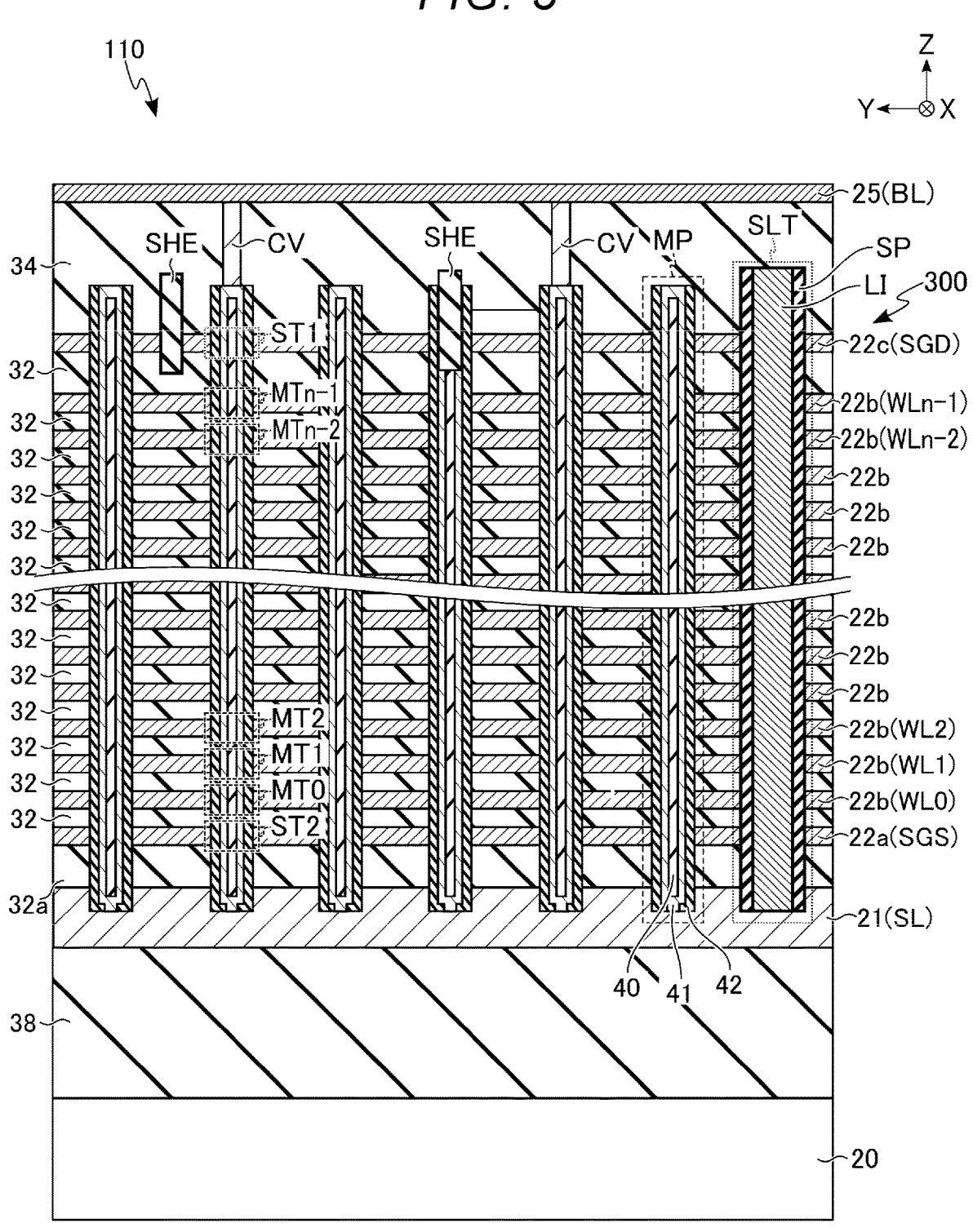
FIG. 3 is a cross-sectional view showing a structural example of the memory cell array of the memory device according to the first embodiment.

FIG. 3 is a cross-sectional view showing an example of a structure of the memory cell array of the memory device 1 according to the present embodiment.

As shown in FIG. 3, the memory cell array 110 further includes a semiconductor substrate (hereinafter, also simply referred to as a substrate) 20, conductive layers 21, 22, and 25, and insulating layers 32*a*, 32, 34, and 38. The memory cell array 110 has a structure (stacked-layer wiring) 300 in which a plurality of the conductive layers 22 (22*a*, 22*b*, and 22*c*) are stacked in a Z direction.

The insulating layer 38 is provided on an upper surface of the semiconductor substrate 20. The insulating layer 38 covers a circuit (not shown) corresponding to, for example, the row control circuit 140 and/or the sense amplifier circuit 150 on the semiconductor substrate 20.

The conductive layer 21 is provided on an upper surface of the insulating layer 38. The conductive layer 21 is, for example, a plate-shaped layer that extends along an X-Y plane. The conductive layer 21 is used as the source line SL. The conductive layer 21 includes, for example, silicon doped with phosphorus.

The insulating layer 32*a* is provided on an upper surface of the conductive layer 21. The conductive layer 22*a* is provided on an upper surface of the insulating layer 32*a*. The conductive layer 22*a* is, for example, a plate-shaped layer that extends along the X-Y plane. The conductive layer 22*a* is used as the source-side select gate line SGS. The conductive layer 22*a* includes, for example, tungsten.

The insulating layer 32 and the conductive layer 22*b* are alternately stacked on an upper surface of the conductive layer 22*a* in the Z direction. The conductive layer 22*b* is, for example, a plate-shaped layer that extends along the X-Y plane. A plurality of stacked conductive layers 22*b* are used as the word lines WL0, . . . , and WLn−1, respectively, in order from the semiconductor substrate 20 side. The conductive layer 22*b* includes, for example, tungsten.

The conductive layer 22*c* is provided above the uppermost conductive layer 22*b* through the insulating layer 32. The conductive layer 22*c* is, for example, a plate-shaped layer that extends along the XY plane. The conductive layer 22*c* is used as the drain-side select gate line SGD. The conductive layer 22*c* includes, for example, tungsten.

The insulating layer 34 is provided on an upper surface of the conductive layer 22*c*. The insulating layer 34 may include a plurality of insulating layers. The conductive layer 25 is provided on an upper surface of the insulating layer 34. The conductive layer 25 is, for example, a line-shaped layer extending in a Y direction. The conductive layer 25 is used as the bit line BL. In a region not shown, a plurality of conductive layers 25 are arranged along an X direction. The conductive layer 25 includes, for example, copper.

Each of memory pillars MP extends along the Z direction and is provided in the stacked-layer wiring 300. The memory pillar MP penetrates the insulating layer 32 and the conductive layer 22. A bottom portion of the memory pillar MP is in contact with the conductive layer 21. A portion in which the memory pillar MP and the conductive layer 22*a* intersect each other functions as the select transistor ST2. A portion in which the memory pillar MP and one conductive layer 22*b* intersect each other functions as one memory cell transistor MT. A portion in which the memory pillar MP and the conductive layer 22*c* intersect each other functions as the select transistor ST1.

Each of the memory pillars MP includes, for example, a core member 40, a semiconductor layer 41, and a stacked-layer film 42. The core member 40 extends in the Z direction. For example, an upper end of the core member 40 is disposed in an upper layer with respect to the conductive layer 22*c*. A lower end of the core member 40 reaches the conductive layer 21. The semiconductor layer 41 covers the periphery of the core member 40. In a lower portion of the memory pillar MP, a part of the semiconductor layer 41 is in contact with the conductive layer 21. The stacked-layer film 42 covers a side surface and a bottom surface of the semiconductor layer 41 except for a portion in which the semiconductor layer 41 and the conductive layer 21 are in contact with each other. The core member 40 includes, for example, an insulator, such as silicon oxide. The semiconductor layer 41 includes, for example, silicon.

A columnar contact CV is provided on an upper surface of the semiconductor layer 41 in the memory pillar MP. Two contacts CV corresponding to two memory pillars MP among the six memory pillars MP are shown in the shown region. The contact CV is connected to the memory pillar MP, which does not overlap a slit SHE and is not connected to the contact CV, in a region not shown (for example, a region in a depth direction or a front direction of a paper surface).

One conductive layer 25 (one bit line BL) is in contact with an upper surface of the contact CV. In each of the spaces partitioned by a slit SLT and the slit SHE, one contact CV is connected to one conductive layer 25. Each of the conductive layers 25 is electrically connected to the memory pillar MP provided between the adjacent slits SLT and SHE, and the memory pillar MP provided between the two adjacent slits SHE.

The slit SLT has a portion provided along an X-Z plane, and divides the conductive layer 22. A contact LI in the slit SLT is provided along the slit SLT. A part of an upper end of the contact LI is in contact with the insulating layer 34. A lower end of the contact LI is in contact with the conductive layer 21. The contact LI is, for example, a conductor used as a part of the source line SL. A spacer SP is provided at least between the contact LI and the conductive layer 22. The contact LI and the conductive layer 22 are disconnected and insulated from each other by the spacer SP. The spacer SP is an insulating layer. It should be noted that the slit SLT may be filled with an insulator.

The slit SHE has a portion provided along the X-Z plane, and at least divides the conductive layer 22c. An upper end of the slit SHE is in contact with the insulating layer 34. A lower end of the slit SHE is in contact with the insulating layer 32 between the uppermost conductive layer 22b and the conductive layer 22c. The slit SHE includes, for example an insulator, such as silicon oxide.

Figure 4:
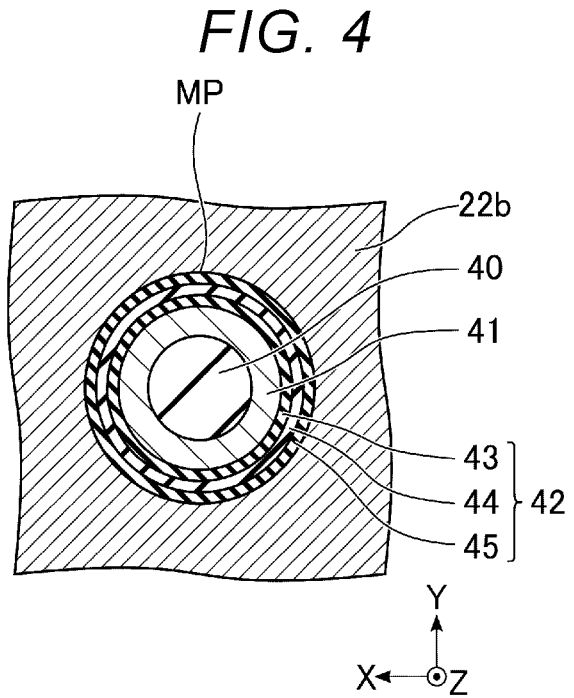
FIG. 4 is a cross-sectional view showing a structural example of a memory pillar of the memory device according to the first embodiment.

FIG. 4 is a cross-sectional view showing an example of a cross-sectional structure of the memory pillar MP in the memory device 1 according to the present embodiment. FIG. 4 shows a cross-sectional structure of the memory pillar MP in a layer parallel to the surface of the semiconductor substrate 20 and including the conductive layer 22b.

As shown in FIG. 4, the stacked-layer film 42 includes, for example, a tunnel insulating film 43, a charge trap film 44, and a block insulating film 45.

In the cross section including the conductive layer 22b, the core member 40 is provided in a central portion of the memory pillar MP. The semiconductor layer 41 surrounds a side surface of the core member 40. The tunnel insulating film 43 surrounds a side surface of the semiconductor layer 41. The charge trap film 44 surrounds a side surface of the tunnel insulating film 43. The block insulating film 45 surrounds a side surface of the charge trap film 44. The conductive layer 22b surrounds a side surface of the block insulating film 45. The tunnel insulating film 43 includes, for example, silicon oxide. The charge trap film 44 includes, for example, silicon nitride. The block insulating film 45 includes, for example, silicon oxide or aluminum oxide.

In each of the memory pillars MP, the semiconductor layer 41 is used as a channel region (current path) of the memory cell transistors MT0, . . . , and MTn−1 and the select transistors ST1 and ST2. The charge trap film 44 is used as the charge storage layer of the memory cell transistor MT. The memory device 1 can cause a current to flow through the memory pillar MP between the bit line BL and the contact LI (source line SL) by turning on the memory cell transistors MT0, . . . , and MTn−1 and the select transistors ST1 and ST2.

(1a-2) Row Control Circuit

A configuration example of the row control circuit in the memory device 1 according to the present embodiment will be described with reference to FIGS. 5 to 8.

Figure 5:
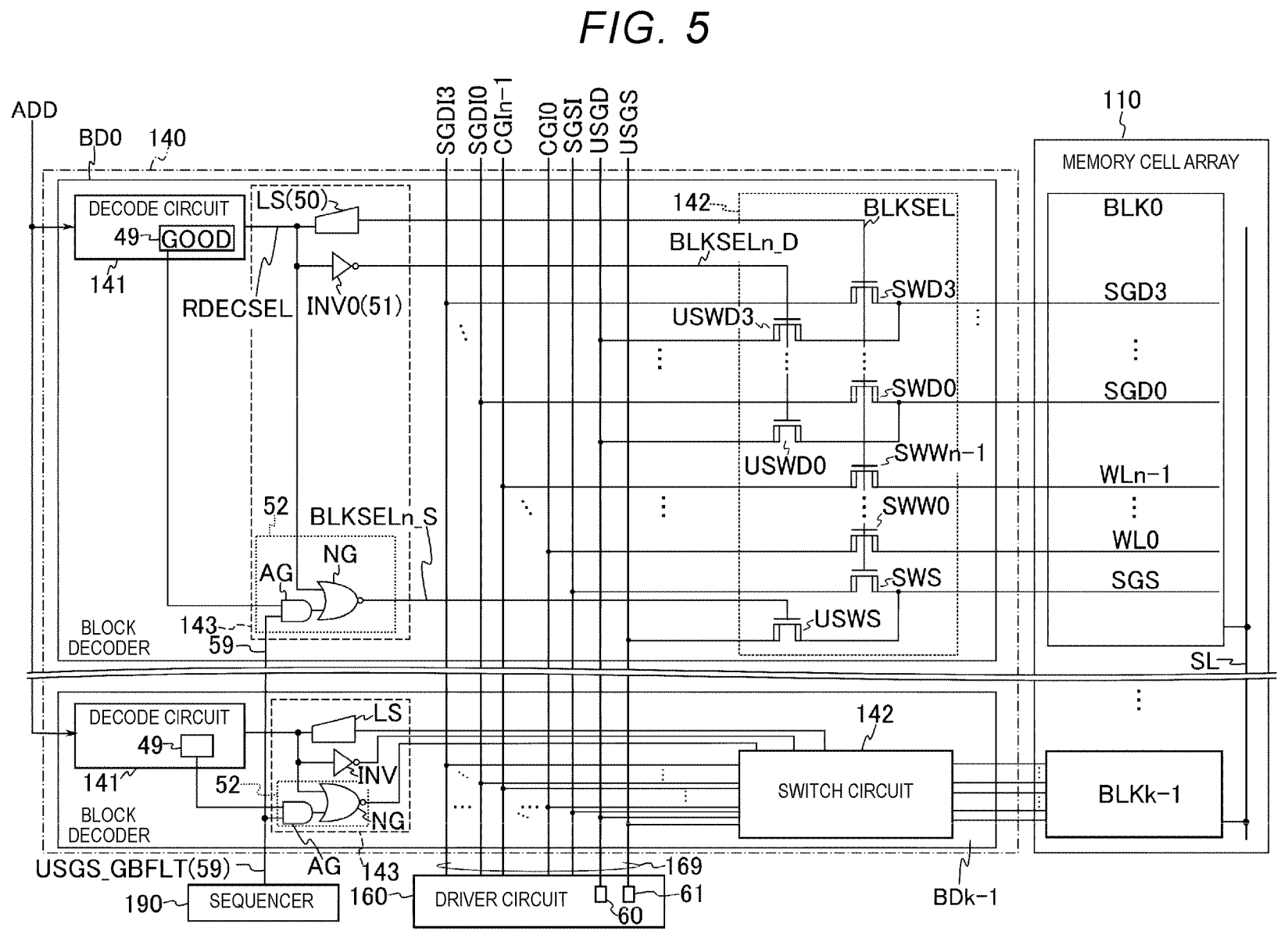

FIG. 5 is a schematic diagram showing a configuration example of the row control circuit 140.

As described above, the row control circuit 140 includes a plurality of block decoders BD (BD0, . . . , and BDk−1). Each of the plurality of block decoders BD corresponds to the plurality of blocks BLK in a one-to-one manner. Each block decoder BD includes a decode circuit 141, a switch circuit 142, and a switch control circuit 143.

The decode circuit 141 decodes the address ADD. The decode circuit 141 is associated with one of the plurality of blocks BLK of the memory cell array 110.

The decode circuit 141 includes a defective block information latch 49. The defective block information latch 49 is a latch that stores information (flag, signal, and data) GOOD indicating whether the block BLK corresponding to the decode circuit 141 is a defective block. For example, when the corresponding block BLK is a defective block, the defective block information GOOD indicates a value of "0". When the corresponding block BLK is not a defective block (when the corresponding block BLK is a non-defective block), the defective block information GOOD indicates a value of "1".

The decode circuit 141 outputs a control signal (decode signal) RDECSEL for setting the corresponding block BLK to be in a selected state or an unselected state, by using the address ADD and the defective block information GOOD.

The details of an internal configuration of the decode circuit 141 will be described later.

The switch circuit (transfer gate circuit) 142 controls the connection between the memory cell array 110 and the driver circuit 160 through the wiring group 169. The switch circuit 142 is associated with one of the plurality of blocks BLK. The switch circuit 142 is associated with the decode circuit 141 with respect to the corresponding block BLK.

The switch circuit 142 includes a plurality of transistors SWD (SWD0, . . . , and SWD3), SWW (SWW0, and SWWn−1), SWS, USWD (USWD0, . . . , and USWD3), and USWS. Each of the transistors SWD, SWW, SWS, USWD, and USWS functions as a switch (transfer switch, transfer gate, or transfer transistor) for connection between a certain wiring of the wiring group 169 and the corresponding wiring in the memory cell array 110. For example, each of the transistors SWD, SWW, SWS, USWD, and USWS is a high breakdown voltage N-channel type field-effect transistor.

When the corresponding block BLK is set to be in the selected state, the plurality of transistors SWD, SWW, and SWS supply (transfer) the voltage output from the driver circuit 160 to the wiring in the corresponding block BLK from the wiring group 169. The wiring group 169 includes a plurality of wirings SGDI (SGDI0, . . . and SGDI3), CGI (CGI0, . . . , and CGIn−1), SGSI, USGD, and USGS.

The gates of the plurality of transistors SWD, SWW, SWS, USWD, and USWS are connected to the switch control circuit 143 described later.

The transistors SWD0, . . . , and SWD3 are associated with the plurality of drain-side select gate lines SGD0, . . . , and SGD3 in the corresponding block BLK in a one-to-one manner. For example, one end (node or terminal) of the current path of the transistor SWD0 is connected to the drain-side select gate line SGD0, and the other end (node or terminal) of the current path of the transistor SWD0 is connected to the wiring SGDI0. For example, one end of the current path of the transistor SWD3 is connected to the drain-side select gate line SGD3, and the other end of the current path of the transistor SWD3 is connected to the wiring SGDI3.

The transistors SWW0, . . . , and SWWn−1 are associated with the plurality of word lines WL0, . . . , and WLn−1 in the corresponding block BLK in a one-to-one manner. For example, one end of the current path of the transistor SWW0 is connected to the word line WL0, and the other end of the current path of the transistor SWW0 is connected to the wiring CGI0. For example, one end of the current path of the transistor SWWn−1 is connected to the word line WLn−1, and the other end of the current path of the transistor SWWn−1 is connected to the wiring CGIn−1.

The transistor SWS is associated with the source-side select gate line SGS in the corresponding block BLK. For example, one end of the current path of the transistor SWS is connected to the source-side select gate line SGS, and the other end of the current path of the transistor SWS is connected to the wiring SGSI.

When the corresponding block BLK is set to be in the unselected state, the plurality of transistors USWD (USWD0, . . . , and USWD3) and USWS supply (transfer) the voltage output from the driver circuit 160 to the wiring in the corresponding block BLK from the wiring group 169.

The transistors USWD0, . . . , and USWD3 are associated with the plurality of drain-side select gate lines SGD0, . . . , and SGD3 in the corresponding block BLK in a one-to-one manner. For example, one end of the current path of the transistor USWD0 is connected to the drain-side select gate line SGD0, and the other end of the current path of the transistor USWD0 is connected to the wiring USGD. For example, one end of the current path of the transistor USWD3 is connected to the drain-side select gate line SGD3, and the other end of the current path of the transistor USWD3 is connected to the wiring USGD.

The transistor USWS is associated with the source-side select gate line SGS in the corresponding block BLK. For example, one end of the current path of the transistor USWS is connected to the source-side select gate line SGS, and the other end of the current path of the transistor USWS is connected to the wiring USGS.

The switch control circuit 143 includes a select control circuit 50, a drain-side unselect switch control circuit 51, and a source-side unselect switch control circuit 52.

The select control circuit 50 includes at least a level shifter LS.

An input node (input terminal) of the level shifter LS is connected to the corresponding decode circuit 141. An output node (output terminal) of the level shifter LS is connected to the gates of the plurality of transistors SWD, SWW, and SWS.

The level shifter LS receives the control signal RDECSEL from the decode circuit 141. The level shifter LS supplies a control signal (a selection signal) BLKSEL having a certain voltage value to the gates of the transistors SWD, SWW, and SWS based on the control signal RDECSEL. The transistors SWD, SWW, and SWS are turned on or off in accordance with a signal level of the control signal BLKSEL. The transistors SWD, SWW, and SWS can transfer a voltage of a certain magnitude in accordance with the voltage value of the control signal BLKSEL.

The drain-side unselect switch control circuit 51 controls the unselected state (deactivation state) of the plurality of drain-side select gate lines SGD in the corresponding block BLK.

The drain-side unselect switch control circuit 51 includes an inverter (NOT gate) INV0. An input node (input terminal) of the inverter INV0 is connected to the corresponding decode circuit 141. An output node (output terminal) of the inverter INV0 is connected to the gates of the plurality of transistors USWD.

The inverter INV0 receives the control signal RDECSEL. The inverter INV0 supplies a control signal BLKSELn_D to the gate of the transistor USWD. The control signal BLKSELn_D is an inverted signal of the control signal RDECSEL. The transistor USWD is turned on or off in accordance with a signal level of the control signal BLKSELn_D.

The source-side unselect switch control circuit 52 controls the source-side select gate line SGS in the corresponding block BLK to be in the unselected state (deactivation state).

The source-side unselect switch control circuit 52 includes an AND gate AG and a NOR gate NG. One input node of the AND gate AG is connected to the corresponding decode circuit 141. The other input node of the AND gate AG is connected to a signal line 59. An output node of the AND gate AG is connected to one input node of the NOR gate NG. The other input node of the NOR gate NG is connected to the corresponding decode circuit 141. An output node of the NOR gate NG is connected to the gate of the transistor USWS.

The signal line 59 is connected to the AND gates AG of the plurality of source-side unselect switch control circuits 52 across the plurality of block decoders BD. A control signal USGS_GBFLT is supplied to the AND gates AG of the plurality of source-side unselect switch control circuits 52 through the signal line 59. For example, the sequencer 190 controls a signal level of the control signal USGS_GBFLT. The control signal USGS_GBFLT is a signal indicating whether the bias state of the source-side select gate line SGS of the unselected block BLK is controlled, in accordance with the defective block information GOOD.

The AND gate AG receives the defective block information GOOD from the corresponding decode circuit 141. The AND gate AG receives the control signal USGS_GBFLT from the sequencer 190. The AND gate AG performs a logical operation (logical AND operation) between the defective block information GOOD and the control signal USGS_GBFLT. The AND gate AG transfers a result of the logical AND operation (AND operation) to the NOR gate NG.

The NOR gate NG receives the control signal RDECSEL from the decode circuit 141 and the result of the AND operation from the AND gate AG. The NOR gate NG executes a logical operation (logical NOR operation) between the control signal RDECSEL and the result of the AND operation. The NOR gate NG supplies a control signal BLKSELn_S indicating a result of the logical NOR operation (NOR operation) to the gate of the transistor USWS. The transistor USWS is turned on or off in accordance with a signal level of the control signal BLKSELn_S.

In the present embodiment, the control when the source-side select gate line SGS in the block BLK is set to be in the unselected state is executed by using the three signals RDECSEL, USGS_GBFLT, and GOOD.

As a result, in the memory device 1 according to the present embodiment, an electrical state (for example, a floating state or a bias state) of the source-side select gate line SGS in the unselected block BLK is controlled independently of the drain-side select gate line SGD in the unselected block BLK by the row control circuit 140 (block decoder BD) including the source-side unselect switch control circuit 52.

It should be noted that the unselected state of the source-side select gate line SGS is controlled by using the signal in the defective block information latch 49. The control of the source-side select gate line SGS in the unselected state may be executed by using a signal in a latch other than the defective block information latch 49 in the block decoder BD.

Each of the plurality of wirings SGDI, CGI, SGSI, USGD, and USGS of the wiring group 169 is connected to one driver of a plurality of drivers in the driver circuit 160. For example, the wiring USGD is connected to a driver (hereinafter, referred to as a USGD driver) 60 of the driver circuit 160. The USGD driver 60 outputs a voltage to be applied to the drain-side select gate line SGD of the unselected block BLK. For example, the wiring USGS is connected to a driver (hereinafter, referred to as a USGS driver) 61 of the driver circuit 160. The USGS driver 61 outputs a voltage to be applied to the source-side select gate line SGS of the unselected block BLK.

(1a-2-1) Decode Circuit

Figure 6:
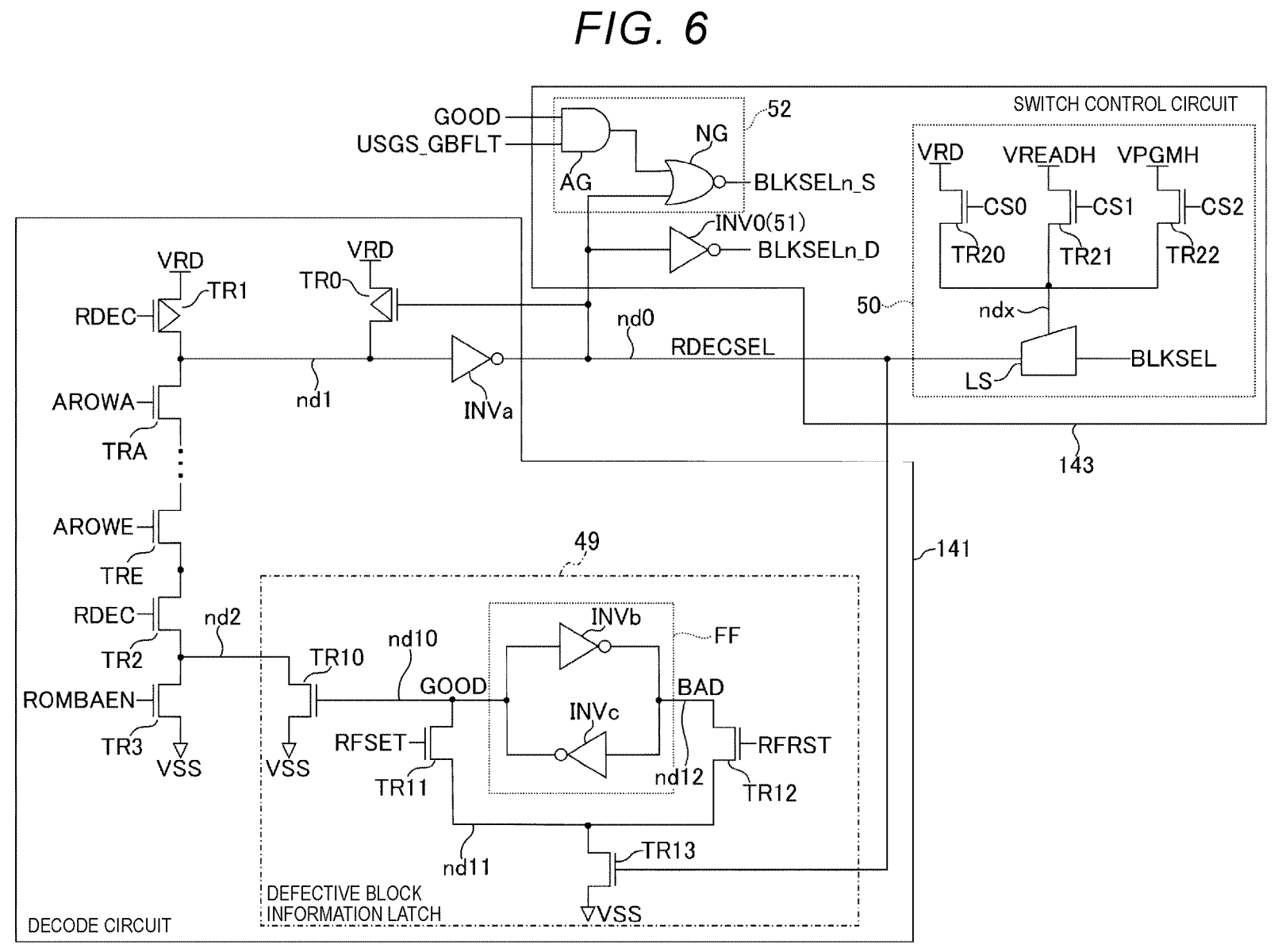

FIG. 6 is a circuit diagram showing the internal configuration of the decode circuit 141 of the block decoder BD in the row control circuit 140 of the memory device 1 according to the present embodiment.

The decode circuit 141 includes a plurality of transistors TR0, TR1, TR2, TR3, TRA, and TRE, an inverter (NOT gate) INVa, and the defective block information latch 49.

An input node of the inverter INVa is connected to a node nd1. An output node of the inverter INVa is connected to a node nd0. The node nd0 is an output node of the decode circuit 141. The inverter INVa outputs the control signal RDECSEL to the node nd0. The control signal RDECSEL is an inverted signal of the signal in accordance with a voltage level of the node nd1.

Transistor TR0 is a P-channel type field-effect transistor. One end of the current path of the transistor TR0 is connected to a power terminal to which a voltage VRD is applied (hereinafter, referred to as a power terminal VRD). The other end of the current path of the transistor TR0 is connected to the node nd1. The gate of the transistor TR0 is connected to the node nd0. The transistor TR0 is turned on or off in accordance with a voltage level of the node nd0 (signal level of the control signal RDECSEL). The voltage VRD is, for example, a voltage of about 3 V.

The transistor TR1 is a P-channel type field-effect transistor. One end of the current path of the transistor TR1 is connected to the power terminal VRD. The other end of the current path of the transistor TR1 is connected to the node nd1. The gate of the transistor TR1 receives a control signal RDEC. When the decode circuit 141 is set to be in a disable state, a signal level of the control signal RDEC is set to the "L" level. When the decode circuit 141 is set to be in an enabled state, the signal level of the control signal RDEC is set to the "H" level.

The plurality of transistors TRA, . . . , and TRE are N-channel type field-effect transistors. The plurality of transistors TRA, . . . , and TRE are connected in series between the node nd1 and the transistor TR2.

One end of the current path of the transistor TRA is connected to the node nd1. The other end of the current path of the transistor TRA is connected to one end of the current path of the transistor TRE through the current paths of the other plurality of transistors. The other end of the current path of the transistor TRE is connected to one end of the current path of the transistor TR2.

Signals AROWA, . . . , and AROWE are supplied to the gates of the transistors TRA, . . . , and TRE, respectively. The signals AROWA, . . . , and AROWE are signals generated based on a block address signal included in the address ADD. When the corresponding block BLK is the selected block, all of the transistors TRA, . . . , and TRE in the decode circuit corresponding to the selected block BLK are turned on based on the signals AROWA, . . . , and AROWE.

The transistor TR2 is an N-channel type field-effect transistor. One end of the current path of the transistor TR2 is connected to the other end of the current path of the transistor TRE. The other end of the current path of the transistor TR2 is connected to a node nd2. The gate of the transistor TR2 receives the control signal RDEC. One of the transistor TR1 and the transistor TR2 is set to be in an on-state in accordance with the signal level of the control signal RDEC.

The transistor TR3 is an N-channel type field-effect transistor. One end of the current path of the transistor TR3 is connected to the node nd2. The other end of the current path of the transistor TR3 is connected to a power terminal (hereinafter, referred to as a ground terminal VSS) to which a ground voltage VSS is applied. The gate of the transistor TR3 receives a control signal ROMBAEN. The transistor TR3 is turned on or off in accordance with a signal level of the control signal ROMBAEN. When the signal level of the control signal ROMBAEN is set to the "H" level, the transistor TR3 is turned on. In this case, a signal level of the node nd2 is set to the "L" level regardless of the on/off of the transistor TR10 controlled in accordance with the defective block information GOOD.

When each of the control signal RDEC and the control signals AROWA, . . . , and AROWE is the "H" level, the signal corresponding to the voltage of the node nd2 is transferred to the node nd1. For example, the nodes nd1 and nd2 store a signal of the "H" level as an initial state of a decode process of the address ADD. When any one of the transistor TR3 and the transistor TR10 is turned on, the node nd2 is grounded. As a result, the signal of the "L" level is transferred from the node nd2 to the node nd1 through the transistors TRA and TRE in the on-state. In this case, a signal level of the node nd1 is the "L" level.

When at least one of the control signal RDEC and the control signals AROWA, . . . , and AROWE is the "L" level, the node nd2 is electrically disconnected from the node nd1. The node nd1 maintains the signal level of the "H" level signal without depending on the on/off of the transistor TR3 and the transistor TR10.

The defective block information latch 49 is connected to the node nd2. The defective block information latch 49 includes a plurality of transistors TR10, TR11, TR12, and TR13 and a flip-flop FF. Each of the plurality of transistors TR10, TR11, TR12, and TR13 is an N-channel type field-effect transistor.

One end of the current path of the transistor TR10 is connected to the node nd2. The other end of the current path of the transistor TR10 is connected to the ground terminal VSS. The gate of the transistor TR10 is connected to a node nd10.

One end of the current path of the transistor TR11 is connected to the node nd10. The other end of the current path of the transistor TR11 is connected to a node nd11. The gate of the transistor TR11 receives a control signal RFSET. The transistor TR11 is turned on or off in accordance with a signal level of the control signal RFSET. The control signal RESET is a signal for setting information (data) indicating that the corresponding block is the defective block in the defective block information latch 49. When any block BLK is selected and the signal level of the control signal RFSET is set to the "H" level in a state where the signal level of the control signal RDECSEL of the decode circuit 141 corresponding to the selected block is set to the "H" level, the signal of the "L" level is transferred to the node nd10. Accordingly, data (signal of the "L (0)" level) indicating that the corresponding block BLK is the defective block is set in the defective block information latch 49.

One end of the current path of the transistor TR12 is connected to a node nd12. The other end of the current path of the transistor TR12 is connected to the node nd11. The gate of the transistor TR12 receives a control signal RFST. The transistor TR12 is turned on or off in accordance with a signal level of the control signal RFRST. The control signal RFRST is a signal for resetting the information (data) indicating that the corresponding block is the defective block from the defective block information latch 49. When the signal level of the control signal RFRST is the "H" level, the signal level of the "L" level is transferred to the node nd12. Along with this, the signal of the "H" level is stored in the node nd10. Accordingly, the data indicating that the corresponding block BLK is the defective block is reset from the defective block information latch 49.

One end of the current path of the transistor TR13 is connected to the node nd11. The other end of the current path of the transistor TR13 is connected to the ground terminal VSS. The gate of the transistor TR13 is connected to the node nd0. The transistor TR13 is turned on or off in accordance with the signal level of the control signal RDECSEL.

The flip-flop FF stores a 1-bit signal indicating the defective block information GOOD. The flip-flop FF is connected between the node nd10 and the node nd12. The flip-flop FF includes two inverters INVb and INVc. An input node of the inverter INVb is connected to the node nd10. An output node of the inverter INVb is connected to the node nd12. An input node of the inverter INVc is connected to the node nd12. An output node of the inverter INVc is connected to the node nd10.

The node nd10 and the node nd11 connected to the flip-flop FF respectively store the signals GOOD and BAD of the logic levels inverted from each other. When the node nd10 stores the signal GOOD of the "H" level and the node nd12 stores the signal BAD of the "L" level, it is indicated that the corresponding block BLK is not the defective block. When the node nd10 stores the signal GOOD of the "L" level and the node nd12 stores the signal BAD of the "H" level, it is indicated that the corresponding block BLK is the defective block.

With the above-described configuration, the decode circuit 141 outputs the control signal RDECSEL of the "H" level when the corresponding block BLK is the selected block indicated by the address ADD and is not the defective block. The decode circuit 141 outputs the control signal RDECSEL of the "L" level when the corresponding block BLK is the unselected block not indicated by the address ADD or is the defective block.

(1a-2-2) Switch Control Circuit

The switch control circuit 143 has the following configuration.

As shown in FIG. 6, the select control circuit 50 of the switch control circuit 143 includes the level shifter LS and transistors TR20, TR21, and TR22.

A first input node of the level shifter LS is connected to the node nd0. The level shifter LS receives the control signal RDECSEL through the node nd0. The level shifter LS outputs a voltage of a node ndx as the control signal BLKSEL when the control signal RDECSEL is the "H" level. The level shifter LS outputs the voltage VSS as the control signal BLKSEL when the control signal RDECSEL is the "L" level.

The level shifter LS is connected to the transistors TR20, TR21, and TR22 through the node ndx.

One end of the current path of the transistor TR20 is connected to the power terminal VRD. The other end of the current path of the transistor TR20 is connected to a second input node (power node) of the level shifter LS through the node ndx. The gate of the transistor TR20 receives a control signal CS0. The transistor TR20 is turned on or off in accordance with the control signal CS0. The transistor TR20 in the on-state transfers the voltage VRD to the level shifter LS. The transistor TR20 in the off-state electrically disconnects the level shifter LS from the power terminal VRD.

The voltage VRD is a voltage that may set the transistors SWD, SWW, and SWS to be in the on-state so that the voltage VRD can be transferred to the word line WL.

One end of the current path of the transistor TR21 is connected to a power terminal to which a voltage VREADH is applied (hereinafter, referred to as a power terminal VREADH). The other end of the current path of the transistor TR21 is connected to the second input node of the level shifter LS through the node ndx. The gate of the transistor TR21 receives a control signal CS1. The transistor TR21 is turned on or off in accordance with the control signal CS1. The transistor TR21 in the on-state transfers the voltage VREADH to the level shifter LS. The transistor TR21 in the off-state electrically disconnects the level shifter LS from the power terminal VREADH.

The voltage VREADH is a voltage that may set the transistor SWW to be in the on-state so that the word line WL can transfer a voltage VREAD. The voltage VREAD is a voltage applied to the word line WL connected to the unselected memory cell MC in the read sequence. The memory cell MC to which the voltage VREAD is applied is turned on without depending on the data stored in the memory cell MC.

One end of the current path of the transistor TR22 is connected to a power terminal to which a voltage VPGMH is applied (hereinafter, referred to as a power terminal VPGMH). The other end of the current path of the transistor TR22 is connected to the level shifter LS through the node ndx. The gate of the transistor TR22 receives a control signal CS2. The transistor TR22 is turned on or off in accordance with the control signal CS2. The transistor in the on-state transfers the voltage VPGMH to the level shifter LS. The transistor TR22 in the off-state electrically disconnects the level shifter LS from the power terminal VPGMH.

The voltage VPGMH is a voltage that may set the transistor SWW to be in the on-state to a degree that the program voltage VPGM can be transferred to the word line WL. The program voltage VPGM is a voltage that can inject charges into the charge storage layer of the memory cell MC into which data is written.

The level shifter LS outputs the control signal BLKSEL having a certain voltage value, based on the control signal RDECSEL of the "H" level. The level shifter LS can supply the control signal BLKSEL having a voltage value in accordance with any one of the three types of voltages VRD, VREADH, and VPGMH to the gates of the transistors SWD, SWW, and SWS in the corresponding switch circuit 142, based on the on/off control of the transistors TR20, TR21, and TR22 in accordance with an operation sequence that should be executed. Accordingly, the transistors SWD, SWE, and SWS, which are the select switches, can transfer the voltage from the driver circuit 160 to the corresponding selected block BLK in accordance with the operation sequence.

The level shifter LS supplies the control signal BLKSEL of the "L" level (ground voltage VSS) to the gates of the transistors SWD, SWW, and SWS based on the control signal RDECSEL of the "L" level. The transistors SWD, SWW, and SWS are turned off by the control signal BLK-SEL of the "L" level. The transistors SWD, SWW, and SWS in the off-state electrically disconnect the drain-side select gate line SGD, the word line WL, and the source-side select gate line SGS from the wirings SGDI, CGI, and SGSI, respectively.

In the switch control circuit 143, the drain-side unselect switch control circuit 51 includes the inverter INV0. The input node of the inverter INV0 is connected to the node nd0. The inverter INV0 outputs the control signal BLKSELn_D that is an inverted signal of the control signal RDECSEL of the node nd0. The control signal BLKSELn_D is supplied to the gate of the transistor USWD in the corresponding switch circuit 142.

The control signal BLKSELn_D of the "L" level sets the transistor USWD to be in the off-state. As a result, when the corresponding block BLK is the selected block, the drain-side select gate line SGD is electrically disconnected from the wiring USGD by the transistor USWD in the off-state. The control signal BLKSELn_D of the "H" level sets the transistor USWD to be in the on-state. Accordingly, when the corresponding block BLK is the unselected block, the drain-side select gate line SGD is electrically connected to the wiring USGD through the transistor USWD in the on-state.

The source-side unselect switch control circuit 52 has the following configuration.

Source-Side Unselect Switch Control Circuit

A configuration example of the source-side unselect switch control circuit 52 will be described with reference to FIGS. 7 and 8 in addition to FIG. 6.

As shown in FIG. 6, in the switch control circuit 143, the source-side unselect switch control circuit 52 includes the AND gate AG and the NOR gate NG.

One input node of the AND gate AG receives the defective block information GOOD from the defective block information latch 49. The other input node of the AND gate AG receives the control signal USGS_GBFLT. The output node of the AND gate AG is connected to the input node of the NOR gate NG. The AND gate AG transfers a result of the AND operation between the defective block information GOOD and the control signal USGS_GBFLT to the NOR gate NG.

One input node of the NOR gate NG is connected to the node nd0. Accordingly, the NOR gate NG receives the control signal RDECSEL from the decode circuit 141. The other input node of the NOR gate NG is connected to the output node of the AND gate AG. Accordingly, the NOR gate NG receives the operation result of the AND gate AG. The NOR gate NG performs the NOR operation between the AND operation result and the control signal RDECSEL. The NOR gate NG outputs the control signal BLKSELn_S indicating the NOR result.

The control signal BLKSELn_S of the "L" level sets the transistor USWS to be in the off-state. Accordingly, the source-side select gate line SGS is electrically disconnected from the wiring USGS by the transistor USWD in the off-state. The control signal BLKSELn_S of the "H" level sets the transistor USWS to be in the on-state. Accordingly, the source-side select gate line SGS is electrically connected to the wiring USGS through the transistor USWS in the on-state.

In the memory device 1 according to the present embodiment, the source-side unselect switch control circuit 52 controls the electrical state of the source-side select gate line SGS by using the defective block information GOOD.

When the corresponding block BLK is the unselected block and the corresponding block BLK is not the defective block, the source-side unselect switch control circuit 52 controls the source-side select gate line SGS to be in an electrically floating state.

When the corresponding block BLK is the unselected block and the corresponding block BLK is the defective block, the source-side unselect switch control circuit 52 controls the voltage of the source-side select gate line SGS to a certain voltage value.

As described above, in the present embodiment, during the operation sequence (for example, the write sequence) for which an instruction for execution is given, the source-side select gate line SGS in the unselected block may be controlled independently from the drain-side select gate line SGD in the unselected block in accordance with the control signal USGS_GBFLT.

Figure 7:
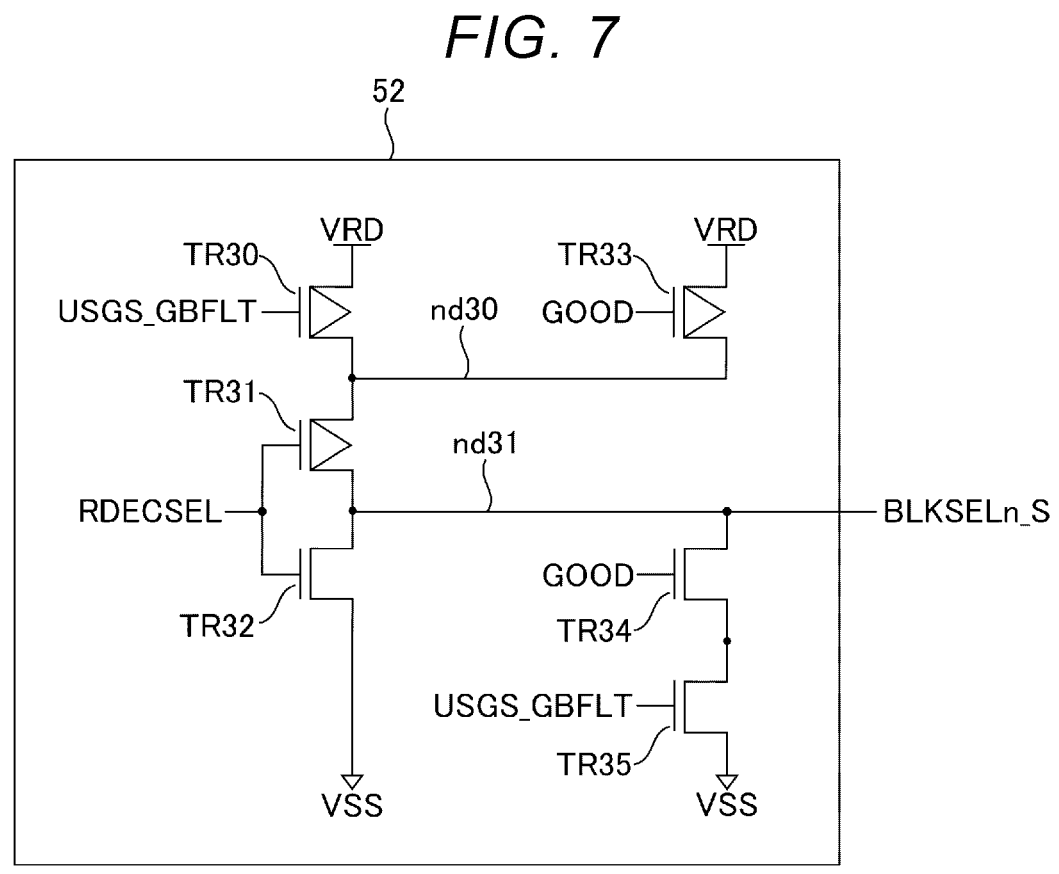
FIG. 7 is a circuit diagram showing a configuration example of a switch control circuit of the memory device according to the first embodiment.

FIG. 7 is an equivalent circuit diagram showing an example of an internal configuration of the source-side unselect switch control circuit 52 in the row control circuit 140 of the memory device 1 according to the present embodiment.

The source-side unselect switch control circuit 52 includes six transistors TR30, TR31, TR32, TR33, TR34, and TR35.

The transistors TR30, TR31, and TR33 are P-channel type field-effect transistors. The transistors TR32, TR34, and TR35 are N-channel type field-effect transistors.

One end of the current path of the transistor TR30 is connected to the terminal to which the voltage VRD is applied (hereinafter, referred to as the power terminal VRD). The other end of the current path of the transistor TR30 is connected to a node nd30. The control signal USGS_GBFLT is supplied to the gate of the transistor TR30.

One end of the current path of the transistor TR31 is connected to the node nd30. The other end of the current path of the transistor TR31 is connected to a node nd31. The control signal RDECSEL is supplied to the gate of the transistor TR31.

One end of the current path of the transistor TR32 is connected to the node nd31. The other end of the current path of the transistor TR32 is connected to the ground terminal VSS. The gate of the transistor TR32 is connected to the gate of the transistor TR31. The control signal RDECSEL is supplied to the gate of the transistor TR32.

One end of the current path of the transistor TR33 is connected to the power terminal VRD. The other end of the current path of the transistor TR33 is connected to the node nd30. The control signal (defective block information) GOOD is supplied to the gate of the transistor TR33.

One end of the current path of the transistor TR34 is connected to the node nd31. The other end of the current path of the transistor TR34 is connected to one end of the current path of the transistor TR35. The other end of the current path of the transistor TR35 is connected to the ground terminal VSS. The defective block information GOOD is supplied to the gate of the transistor TR34. The control signal USGS_GBFLT is supplied to the gate of the transistor TR35.

As described above, the source-side unselect switch control circuit 52 includes the six transistors TR30 to TR35.

The transistors TR30 and TR35 are turned on or off in accordance with the control signal USGS_GBFLT. The transistors TR31 and TR32 are turned on or off in accordance with the control signal RDECSEL. The transistors TR33 and TR34 are turned on or off in accordance with the defective block information GOOD.

The control signal BLKSELn_S having a signal level in accordance with the on or off of each of the transistors TR30, TR31, TR32, TR33, TR34, and TR35 is output from the node nd31.

For example, when the defective block information GOOD is the level "H (1)", the control signal USGS_GBFLT is the "H" level, and the control signal RDECSEL is the level "L (0)", the control signal BLKSELn_S of the "L" level is output from the node nd31.

For example, when the defective block information GOOD is the "L" level, the control signal USGS_GBFLT is the "H" level, and the control signal RDECSEL is the "L" level, the control signal BLKSELn_S of the "H" level is output from the node nd31.

FIG. 8 is a diagram showing an operation state of the source-side unselect switch control circuit 52 in the memory device 1 according to the present embodiment. FIG. 8 shows the memory device 1 according to the present embodiment that is controlled in accordance with the defective block information GOOD. That is, the signal level of the control signal ROMBAEN is set to the "L" level.

In the present embodiment, when the signal level of the control signal USGS_GBFLT is set to the "0" level ("L" level), when the corresponding block BLK is the selected block and the non-defective block, the source-side select gate line SGS is separated from the USGS driver 61. In addition, when the corresponding block BLK is the selected block and the defective block, the source-side select gate line SGS is set to be in the bias state by the USGS driver 61. In addition, when the corresponding block BLK is the unselected block, the source-side select gate line SGS is set to be in the bias state by the USGS driver 61 even when the defective block information GOOD is the "1" level or the "0" level.

In the present embodiment, when the signal level of the control signal USGS_GBFLT is set to the "1" level ("H" level), when the corresponding block BLK is the selected block and the non-defective block, the source-side select gate line SGS is separated from the USGS driver 61. In addition, when the corresponding block BLK is the selected block and the defective block, the source-side select gate line SGS is set to be in the bias state by the USGS driver 61. In addition, when the corresponding block BLK is the unselected block, the source-side select gate line SGS is set to be in the electrically floating state when the corresponding defective block information GOOD is the "1" level, that is, the non-defective block, and is set to be in the bias state when the corresponding defective block information GOOD is the "0" level, that is, the defective block.

That is, when the source-side select gate line SGS is set to be in the bias state or the floating state depending on the defective block information GOOD, the signal level of the control signal USGS_GBFLT is set to the "1" level.

The signal level of the control signal USGS_GBFLT may be fixed based on the parameter PRM stored in the sequencer 190, for example, or may be variably controlled by the sequencer 190 in accordance with the operation of the memory device 1.

When the corresponding block BLK is the selected block and the non-defective block, the signal level of the control signal RDECSEL is the "1" level. When the corresponding block BLK is the unselected block or the defective block, the signal level of the control signal RDECSEL is the "0" level. As described above, the defective block information GOOD of the "1" level indicates the non-defective block, and the defective block information GOOD of the "0" level indicates the defective block.

As shown in FIG. 8, when the signal level of the control signal USGS_GBFLT is the "0" level and the signal level of the control signal RDECSEL is the "0" level, the signal level of the control signal BLKSELn_S is set to the "1" level even when the defective block information GOOD is the "0" level or the "1" level. Therefore, the transistor USWS is turned on.

When the signal level of the control signal USGS_GBFLT is the "0" level and the signal level of the control signal RDECSEL is the "1" level, the signal level of the control signal BLKSELn_S is set to the "0" level even when the defective block information GOOD is the "0" level or the "1" level. Therefore, the transistor USWS is turned off.

When the signal level of the control signal USGS_GBFLT is the "1" level and the signal level of the control signal RDECSEL is the "0" level, the signal level of the control signal BLKSELn_S is set to the "0" level in accordance with the defective block information GOOD of the "1" level. Therefore, the transistor USWS is turned off.

When the signal level of the control signal USGS_GBFLT is the "1" level and the signal level of the control signal RDECSEL is the "0" level, the signal level of the control signal BLKSELn_S is set to the "1" level in accordance with the defective block information GOOD of the "0" level. Therefore, the transistor USWS is turned on.

When the signal level of the control signal USGS_GBFLT is the "1" level and the signal level of the control signal RDECSEL is the "1" level, the signal level of the control signal BLKSELn_S is set to the "0" level even when the defective block information GOOD is the "0" level or the "1" level. Therefore, the transistor USWS is turned off.

As described above, in the memory device 1 according to the present embodiment, when the corresponding block BLK is the unselected block, the voltage state of the source-side select gate line SGS in the corresponding block BLK can be controlled in accordance with whether the corresponding block BLK is the non-defective block or the defective block.

(1b) Operation Example

An operation example of the memory device 1 according to the present embodiment will be described with reference to FIGS. 9 to 12.

Operation of Row Control Circuit 140

Figure 9:
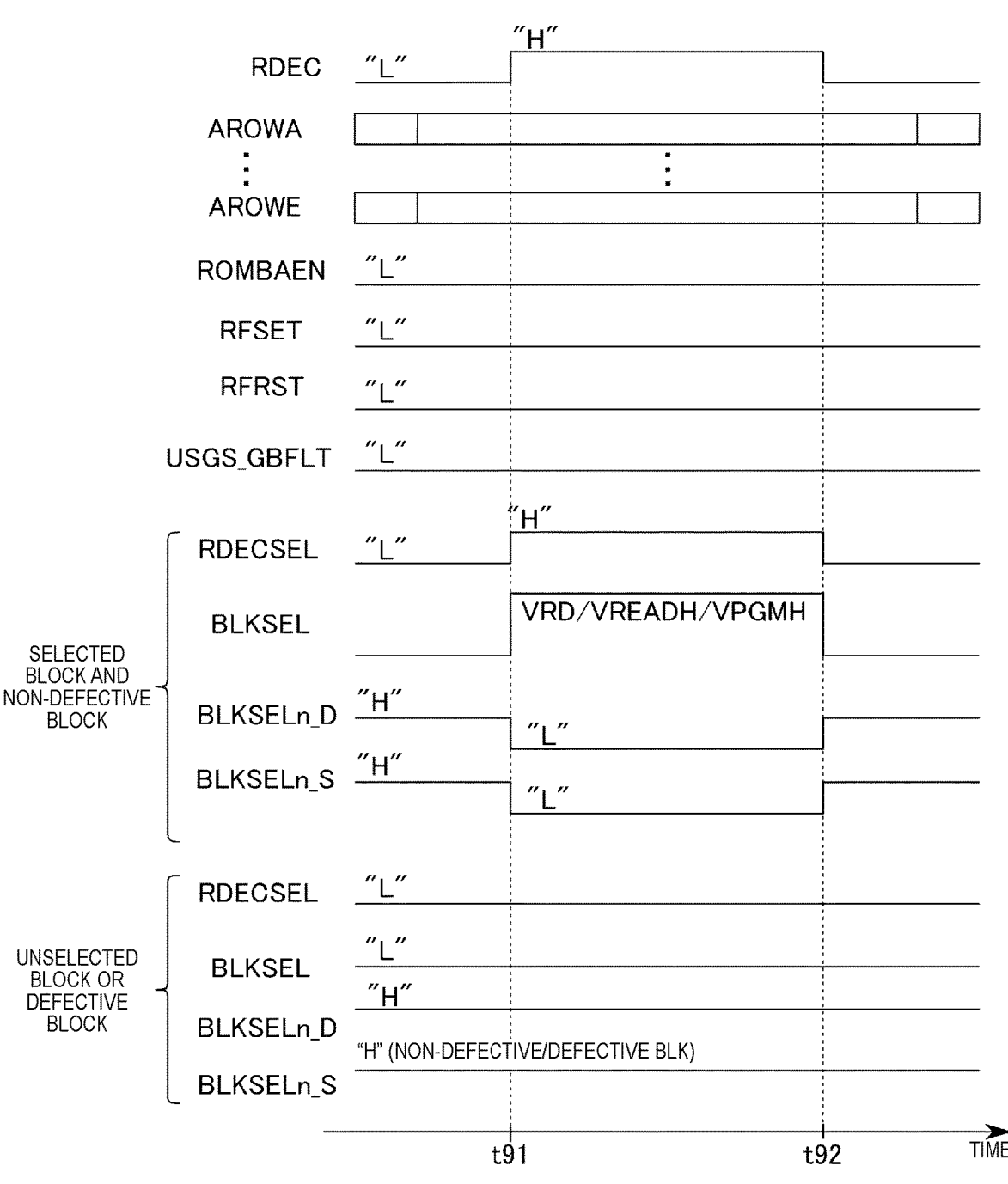
FIG. 9 is a timing chart showing an operation example of the row control circuit of the memory device according to the first embodiment.
Figure 10:
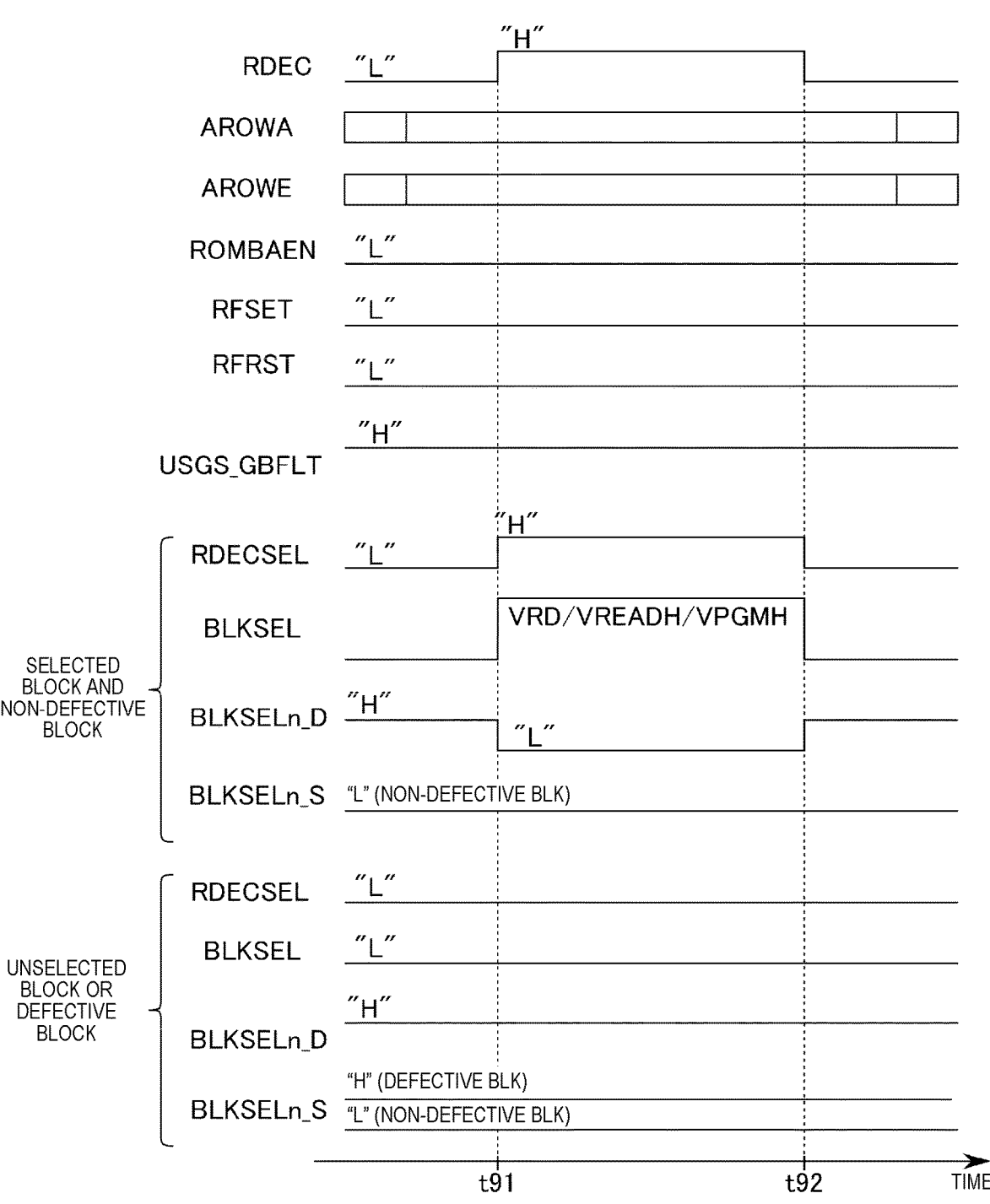
FIG. 10 is a timing chart showing an operation example of the row control circuit of the memory device according to the first embodiment.
Figure 11:
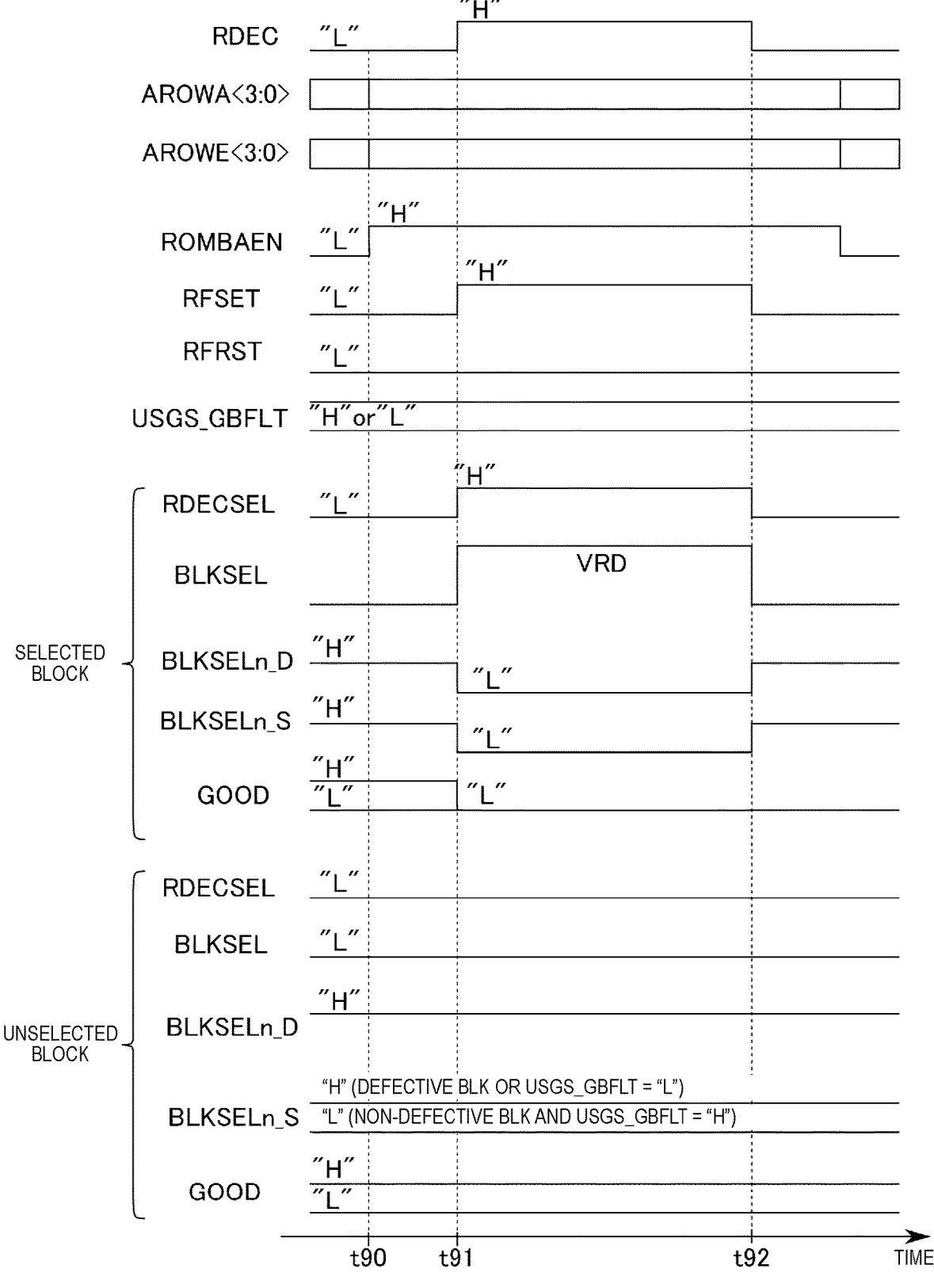
FIG. 11 is a timing chart showing an operation example of the row control circuit of the memory device according to the first embodiment.

As shown in FIGS. 9 to 11, in the memory device 1 according to the present embodiment, the block decoder BD of the row control circuit 140 operates.

FIG. 9 shows a timing chart related to the transition of various signals of the block decoder BD when the signal level of the control signal USGS_GBFLT is the "L (0)" level during a normal operation sequence in accordance with the command.

As shown in FIG. 9, during the normal operation sequence of the memory device 1, the control signal ROM-BAEN, the control signal RFSET, and the control signal RFRST are set to the "L" level. The transistors TR3, TR11, and TR12 are turned off during the normal operation sequence.

Before the start of the operation sequence, the transistor TR1 is turned on and the transistor TR2 is turned off in a period in which the control signal RDEC is the "L" level. The node nd1 is charged with the voltage VRD corresponding to the "H" level by the transistor TR1 in the on-state. The voltage (signal level) of the node nd0 is set to the "L" level in accordance with the node nd1 of the "H" level.

The address ADD is supplied to the row control circuit 140 in accordance with the start of the operation sequence. The control signals AROWA, . . . , and AROWE based on the supplied address ADD are supplied to the respective block decoders BD. The transistors TRA, . . . , and TRE are turned on or off in accordance with the control signals AROWA, . . . , and AROWE. When the corresponding block BLK is a block indicated by the address ADD, that is, in the selected block decoder BD, the transistors TRA, . . . , and TRE are turned on. When the corresponding block BLK is a block not indicated by the address ADD, that is, in the unselected block decoder BD, one or more of the transistors TRA, . . . , and TRE are turned off.

The transistor TR10 is turned on or off in accordance with the defective block information GOOD of the defective block information latch 49. When the corresponding block BLK is the non-defective block, the transistor TR10 is turned on.

At time t91, the signal level of the control signal RDEC changes from the "L" level to the "H" level. Therefore, the transistor TR1 is turned off, and the transistor TR2 is turned on.

When the corresponding block is the selected block and the non-defective block (when the corresponding block is the target of the operation), the node nd1 is electrically connected to the ground terminal through the transistors TRA, . . . , TRE, TR2, and TR10 in the on-state. As a result, the voltage of the node nd1 is set to the "L" level.

The inverter INVa outputs the control signal RDECSEL of the "H" level to the node nd0 in accordance with the signal of the "L" level supplied from the node nd1.

The level shifter LS operates in accordance with the control signal RDECSEL of the "H" level. The level shifter LS outputs the signal of the "H" level having any one voltage value of the voltage VRD, the voltage VREADH, and the voltage VPGMH, in accordance with the operation sequence executed based on the command CMD. Therefore, the transistors SWD, SWW, and SWS are turned on.

In the drain-side unselect switch control circuit 51, when the inverter INV0 receives the control signal RDECSEL of the "H" level, the inverter INV0 outputs the control signal BLKSELn_D of the "L" level. Therefore, the transistor USWD is turned off.

In the source-side unselect switch control circuit 52, the AND gate AG receives the control signal USGS_GBFLT of the "L" level and the signal GOOD of the "H" level. Accordingly, the AND gate AG outputs the signal of the "L" level. The NOR gate NG receives the signal of the "L" level from the AND gate AG and the control signal RDECSEL of the "H" level. In this case, the NOR gate NG outputs the control signal BLKSELn_S of the "L" level. Therefore, the transistor USWS is turned off.

At time t92, the signal level of the control signal RDEC transitions from the "H" level to the "L" level. The control signal RDECSEL transitions from the "H" level to the "L" level in accordance with the control signal RDEC of the "L" level.

As a result, the signal level of the control signal BLKSEL transitions from the "H" level to the "L" level, and the transistors SWD, SWW, and SWS are turned off.

The signal level of the control signal BLKSELn_D and the signal level of the control signal BLKSELn_S transition from the "L" level to the "H" level. The transistors USWD and USWS are turned on by the control signals BLKSELn_D and BLKSELn_S of the "H" level.

When the corresponding block BLK is different from the block indicated by the address ADD (when the corresponding block is the unselected block), at least one of the plurality of control signals AROWA, . . . , and AROWE has the signal level of the "L" level. In this case, the transistors TRA, . . . , and TRE that receive the control signals AROWA, . . . , and AROWE of the "L" level are turned off. Alternatively, when the block BLK indicated by the address ADD is the defective block, the transistor TR10 is turned off by the signal GOOD of the "L" level. In these cases, when the voltage of the node nd1 is maintained at the "H" level, and the corresponding block is the unselected block or the defective block, the signal level of the control signal RDEC-SEL is set to the "L" level. The transistor TR0 is turned on by the control signal RDECSEL of the "L" level. Accordingly, the node nd1 is electrically connected to the power terminal VRD through the transistor TR0 in the on-state, and the level of the node nd1 is maintained.

The level shifter LS outputs the voltage VSS in accordance with the control signal RDECSEL of the "L" level. Therefore, the transistors SWD, SWW, and SWS are turned off.

The inverter INV0 outputs the control signal BLKSELn_D of the "H" level in accordance with the control signal RDECSEL of the "L" level. Therefore, the transistor USWD is turned on.

In the example of FIG. 9, when the signal level of the control signal USGS_GBFLT is the "L" level, the AND gate AG of the source-side unselect switch control circuit 52 outputs the signal of the "L" level to the NOR gate NG without depending on the value of the defective block information GOOD. The NOR gate NG outputs the control signal BLKSELn_S of the "H" level in accordance with the signal of the "L" level and the control signal RDECSEL of the "L" level. Therefore, the transistor USWS is turned on.

FIG. 10 shows a timing chart related to the transition of various signals of the block decoder BD when the signal level of the control signal USGS_GBFLT is the "H (1)" level during a normal operation sequence in accordance with the command.

As described above, at time t91, the signal level of the control signal RDEC transitions from the "L" level to the "H" level. When the selected block is the non-defective block, the voltage of the node nd1 changes from the "H" level to the "L" level. The inverter INVa outputs the signal RDECSEL of the "H" level to the node nd0.

The level shifter LS outputs the control signal BLKSEL of the "H" level having any one of the voltage VRD, the voltage VREADH, and the voltage VPGMH, in accordance with the signal RDECSEL of the "H" level. Therefore, the transistors SWD, SWW, and SWS are turned on.

The inverter INV0 outputs the control signal BLKSELn_D of the "L" level in accordance with the signal RDECSEL of the "H" level. Therefore, the transistor USWD is turned off.

The AND gate AG receives the signal GOOD of the "H" level and the control signal USGS_GBFLT of the "H" level, and outputs the signal of the "H" level to the NOR gate NG. The NOR gate NG receives the control signal RDECSEL of the "H" level and the signal of the "H" level, and outputs the signal BLKSELn_S of the "L" level. Therefore, the transistor USWS is turned off.

At time t92, the transistors SWD, SWW, and SWS are turned off by the control signal BLKSEL of the "L" level. The transistor USWD is turned on by the control signal BLKSELn_D of the "H" level. The AND gate AG receives the signal GOOD of the "H" level and the control signal USGS_GBFLT of the "H" level, and outputs the signal of the "H" level to the NOR gate NG. The NOR gate NG receives the control signal RDECSEL of the "L" level and the signal of the "H" level, and outputs the signal BLKSELn_S of the "L" level. Therefore, the transistor USWS maintains the off state.

When the corresponding block BLK is different from the block indicated by the address ADD (when the corresponding block is the unselected block), the transistors TRA, . . . , and TRE that receive the control signals AROWA, . . . , and AROWE of the "L" level are turned off.

When the selected block is the defective block, the transistor TR10 is turned off in accordance with the signal GOOD of the "L" level.

The voltage of the node nd1 is maintained at the "H" level by the transistors TRA, . . . , and TRE in the off-state or the transistor TR10 in the off-state. The inverter INVa outputs the control signal RDECSEL of the "L" level. The transistor TR0 in the on-state electrically connects the node nd1 to the power terminal VRD by the control signal RDECSEL of the "L" level, and the level of the node nd1 is maintained.

The level shifter LS outputs the control signal BLKSEL of the "L" level having the voltage VSS in accordance with the control signal RDECSEL of the "L" level. Therefore, the transistors SWD, SWW, and SWS are turned off.

The inverter INV0 outputs the control signal BLKSELn_D of the "H" level in accordance with the control signal RDECSEL of the "L" level. Therefore, the transistor USWD is turned on.

In the example of FIG. 10, when the signal level of the control signal USGS_GBFLT is the "H" level, the AND gate AG of the source-side unselect switch control circuit 52 outputs the signal having the signal level in accordance with the value of the defective block information GOOD to the NOR gate NG.

When the defective block information GOOD is the signal of the "H" level indicating the non-defective block, the AND gate AG outputs the signal of the "H" level. The NOR gate NG outputs the control signal BLKSELn_S of the "L" level in accordance with the control signal RDECSEL of the "L" level and the signal of the "H" level from the AND gate AG. As a result, the transistor USWS corresponding to the unselected block of the non-defective block is turned off.

When the defective block information GOOD is the signal of the "L" level indicating the defective block, the AND gate AG outputs the signal of the "L" level. The NOR gate NG outputs the control signal BLKSELn_S of the "H" level in accordance with the control signal RDECSEL of the "L" level and the signal of the "L" level from the AND gate AG. Accordingly, the transistor USWS corresponding to the defective block is turned on.

FIG. 11 shows a timing chart related to the transition of various signals of the block decoder in an operation of a defective block set sequence in which the information GOOD indicating that the corresponding block is the defective block is stored in the defective block information latch 49.

As shown in FIG. 11, when the information indicating that the corresponding block is the defective block is stored in the defective block information latch 49, the signal level of the control signal ROMBAEN transitions from the "L" level to the "H" level at time t90 before the signal level of the control signal RDEC is set to the "H" level. The transistor TR3 is turned on by the control signal ROMBAEN of the "H" level. The node nd2 is electrically connected to the ground terminal VSS through the transistor TR3 in the on-state.

At time t91, the control signal RDEC is set to the "H" level. The signal level of the control signal RFSET is set to the "H" level together with the control signal RDEC. The transistor TR11 is turned on by the control signal RFSET of the "H" level.

When the signal level of the control signal RDEC, the signal levels of the signals AROWA, and AROWE, and the signal level of the control signal ROMBAEN are the "H" level, the node nd1 is electrically connected to the ground terminal VSS through the transistors TRA, . . . , TRE, TR2, and TR3 in the on-state without depending on the defective block information GOOD. Therefore, the voltage of the node nd1 is set to the "L" level. The signal level of the control signal RDECSEL output from the inverter INVa changes from the "L" level to the "H" level in accordance with the signal of the "L" level of the node nd1.

The signal RDECSEL of the "H" level is supplied to the gate of the transistor TR13. The transistor TR13 is turned on by the signal RDECSEL of the "H" level.

In the example of FIG. 11, the transistor TR11 is turned on by the control signal RFSET of the "H" level.

In the defective block information latch 49, the node nd10 is electrically connected to the ground terminal VSS through the transistors TR11 and TR13 in the on-state. As a result, the voltage (signal level) of the node nd10 is set to the "L" level.

As described above, in the defective block information latch 49 of the selected block, the information GOOD of the "L" level indicating the defective block is transferred to the node nd10.

In the defective block set sequence, the signal levels of various control signals other than the above-described control signals with respect to the selected block or the unselected block transition as follows.

In the selected block, the signal level of the control signal RDECSEL changes from the "L" level to the "H" level in accordance with the voltage of the node nd1 set to the ground voltage VSS.

The level shifter LS outputs the control signal BLKSEL of the voltage VRD in accordance with the control signal RDECSEL of the "H" level. Therefore, the transistors SWD, SWW, and SWS are turned on, but it is not necessary to access the memory cell array in this sequence. Therefore, the voltages of SGDI (SGDI0, . . . , and SGDI3), CGI (CGI0, . . . , and CGIn−1), SGSI, USGD, and USGS, which are the outputs of the driver circuit 160, are all constant at the ground voltage VSS.

In the drain-side unselect switch control circuit 51, the inverter INV0 outputs the control signal BLKSELn_D of the "L" level in accordance with the control signal RDECSEL of the "H" level. Therefore, the transistor USWD is turned off.

In the source-side unselect switch control circuit 52, the AND gate AG outputs the signal of the "L" level in accordance with the control signal GOOD of the "L" level, without depending on the signal level of the control signal USGS_GBFLT. The NOR gate NG outputs the control signal BLKSELn_S of the "L" level in accordance with the signal of the "L" level from the AND gate AG and the control signal RDECSEL of the "H" level. Therefore, the transistor USWS is turned off.

In the unselected block, the control signal RDECSEL is maintained at the "L" level.

The level shifter LS outputs the control signal BLKSEL of the ground voltage VSS in accordance with the control signal RDECSEL of the "L" level. Therefore, the transistors SWD, SWW, and SWS are turned off.

The inverter INV0 outputs the control signal BLKSELn_D of the "H" level in accordance with the control signal RDECSEL of the "L" level. Therefore, the transistor USWD is turned on.

The AND gate AG outputs the signal in accordance with the AND operation between the signal level of the signal GOOD and the signal level of the control signal USGS_GBFLT.

When the AND gate AG receives the signal GOOD of the "H" level and the control signal USGS_GBFLT of the "H" level, the AND gate AG outputs the signal of the "H" level to the NOR gate NG. In this case, the NOR gate NG outputs the control signal BLKSELn_S of the "L" level in accordance with the signal of the "H" level and the signal RDECSEL of the "L" level. Therefore, the transistor USWD is turned off.

When the AND gate AG receives the signal GOOD of the "H" level and the control signal USGS_GBFLT of the "L" level, the AND gate AG outputs the signal of the "L" level to the NOR gate NG. In this case, the NOR gate NG outputs the control signal BLKSELn_S of the "H" level in accordance with the signal of the "L" level and the signal RDECSEL of the "L" level. Therefore, the transistor USWD is turned on.

When the AND gate AG receives the signal GOOD of the "L" level, the AND gate AG outputs the signal of the "L" level to the NOR gate NG without depending on the signal level of the control signal USGS_GBFLT. In this case, the NOR gate NG outputs the control signal BLKSELn_S of the "H" level in accordance with the signal of the "L" level and the signal RDECSEL of the "L" level. Therefore, the transistor USWD is turned on.

As described above, the block decoder BD operates in accordance with the defective block information GOOD and the control signal USGS_GBFLT.

It should be noted that, although not shown, the input of the control signal RFSET and the control signal RFRST are exchanged with respect to FIG. 11, so that the information GOOD of the "H" level indicating the non-defective block can be set. This will be referred to as a defective block reset sequence, and in combination with the above-described defective block set sequence, it is possible to set whether each block is the non-defective block or the defective block in all the blocks in the memory device 1. In a shipping test process of the memory device 1, a result of a logical OR operation between fail information of each operation test of each block BLK in each chip may be written into a dedicated power-on initialization data recording block in the memory cell array 110, and then the set data may be set in the defective block information latch 49 by the above-described defective block reset/set sequence in a power-on sequence of the memory device 1. Alternatively, based on the shipping test or the fail result during the operation of the shipping test through the memory system SYS or the host device 9, a command indicating a dedicated defective block reset/set sequence for the memory device 1 may be transferred to the memory device 1 (or the memory system SYS), and the set data related to the non-defective block/defective block may be set by the defective block reset/set sequence in the memory device 1 (or the memory system SYS) that receives the command. The information can be stored in any block in the memory device 1.

Operation of Memory Cell Array

The operation example of the memory device according to the present embodiment will be described with reference to FIG. 12.

Figure 12:
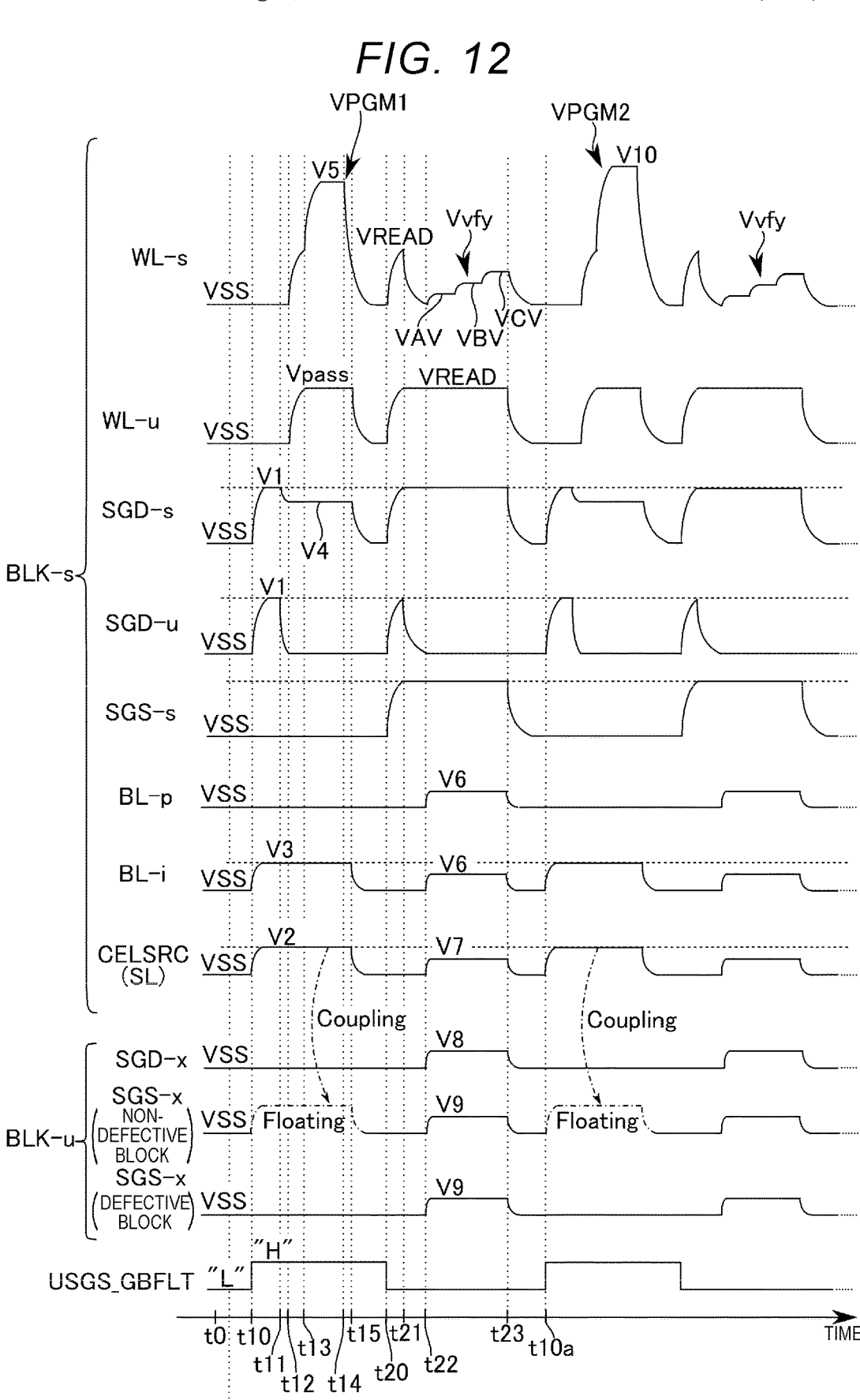
FIG. 12 is a timing chart showing an operation example of the memory device according to the first embodiment.

FIG. 12 is a timing chart showing the operation example of the memory device 1 according to the present embodiment. FIG. 12 is a diagram showing the write sequence of the memory device according to the present embodiment.

As shown in FIG. 12, at time to, the write sequence of the memory device according to the present embodiment is started. The row control circuit 140 and the sense amplifier circuit 150 control the voltages of the word line WL, the select gate lines SGD and SGS, and the bit line BL under the control of the sequencer 190.

In the row control circuit 140, each of the block decoders BD decodes the address ADD. Each of the block decoders BD recognizes whether the corresponding block BLK is the non-defective block or the defective block by using the data (defective block information) GOOD in the defective block information latch 49.

The decode circuit 141 of a certain block decoder BD determines that a certain block BLK is a selected block (hereinafter, also referred to as a target block) BLK-s that is a target of the operation sequence based on the result of decoding the address ADD and the defective block information GOOD. A block (hereinafter, also referred to as a non-target block) BLK-u other than the selected block BLK-s that is the target of the operation sequence is set to be in the unselected state. The target block is the non-defective block indicated by the address ADD. The non-target block includes the non-defective block that is not indicated by the address ADD, the defective block that is not indicated by the address ADD, and the defective block that is indicated by the address ADD.

The switch control circuit 143 corresponding to the target block BLK-s that is the target of the operation sequence controls the switch circuit 142 corresponding to the selected block BLK-s based on the control signal RDECSEL from the decode circuit 141. In the switch circuit 142 corresponding to the selected block BLK-s, the plurality of transistors SWD, SWW, and SWS are turned on by the control signal BLKSEL of the "H" level. In the switch circuit 142 corresponding to the selected block BLK-s, the plurality of transistors USWD and USWS are turned off by the control signals BLKSELn_D and BLKSELn_S of the "L" level.

The switch control circuit 143 corresponding to the unselected block BLK-u or the defective block BLK-u that is not the target of the operation sequence controls the operation of the switch circuit 142 corresponding to the unselected/defective block BLK-u based on the control signal USGS_GBFLT, the control signal RDECSEL from the decode circuit 141, and the defective block information GOOD. Hereinafter, the unselected block BLK-u or the aggregate of the defective blocks BLK-u will be referred to as the unselected/defective block BLK-u.

The select control circuit 50 corresponding to the unselected/defective block BLK-u supplies the control signal BLKSEL of the "L" level to the transistors SWD, SWW, and SWS. The transistors SWD, SWW, and SWS are turned off by the control signal BLKSEL of the "L" level.

The drain-side unselect switch control circuit 51 corresponding to the unselected/defective block BLK-u supplies the control signal BLKSELn_D of the "H" level to the transistor USWD. The transistor USWD is turned on by the control signal BLKSELn_D of the "H" level.

The source-side unselect switch control circuit 52 corresponding to the unselected/defective block BLK-u supplies the control signal RDECSEL of the "L" level, and the control signal BLKSELn_S having a signal level in accordance with the logical operation between the defective block information GOOD and the control signal USGS_GBFLT, to the transistor USWS. The transistor USWS is turned on or off in accordance with the signal level of the control signal BLKSELn_S.

The sequencer 190 executes a program operation in a write loop of the write sequence. The write loop includes the program operation and a verify operation (program verify).

Time t10

At time t10, the driver circuit 160 raises voltages of drain-side select gate lines SGD-s and SGD-u of the selected block BLK-s. A voltage V1 is applied to the drain-side select gate lines SGD-s and SGD-u of the selected block BLK-s. The voltage V1 is a voltage at which a drain-side select transistor ST1 (and a source-side select transistor ST2) is turned on. As a result, the channel of the drain-side select transistor ST1 is precharged.

The driver circuit 160 applies the ground voltage VSS (0 V) to the source-side select gate lines SGSs of the selected block BLK-s.

The driver circuit 160 raises a voltage of a source line CELSRC (SL). A voltage V2 is applied to the source line CELSRC.

The sense amplifier circuit 150 raises a voltage of a bit line BL-i corresponding to the memory cell in which the program is prohibited. A voltage V3 is applied to the bit line BL-i corresponding to the memory cell MC in which the program is prohibited. For example, the voltage V3 is equal to the voltage V2. The sense amplifier circuit 150 applies the ground voltage VSS to a bit line BL-p corresponding to memory cell that is a program target.

Regarding the unselected/defective block BLK-u, the drain-side unselect switch control circuit 51 and the source-side unselect switch control circuit 52 control the electrical states of a drain-side select gate line SGD-x and a source-side select gate line SGS-x.

The drain-side unselect switch control circuit 51 supplies the signal of the "H" level to the gate of the transistor USWD, which is the unselect switch, in accordance with the control signal BLKSELn_D from the decode circuit 141. The transistor USWD is turned on by the signal of the "H" level. Accordingly, the drain-side select gate line SGD-x in the unselected/defective block BLK-u is electrically connected to the wiring USGD through the transistor USWD in the on-state. The ground voltage VSS is applied to the drain-side select gate line SGD-x.

In the present embodiment, the sequencer 190 changes the signal level of the control signal USGS_GBFLT from the "L" level ("0" level) to the "H" level ("1" level) at time t10.

The control signal USGS_GBFLT of the "H" level is supplied to the source-side unselect switch control circuit 52. The defective block information GOOD is supplied to the source-side unselect switch control circuit 52. When the signal level of the control signal USGS_GBFLT is the "H" level, the source-side unselect switch control circuit 52 controls the on and off of the transistor USWS, which is the unselect switch, in accordance with the defective block information GOOD.

As shown in FIG. 8, when the defective block information GOOD has a value ("L (0)") indicating that the corresponding block BLK is the defective block, the source-side unselect switch control circuit 52 supplies the control signal BLKSELn_S of the "H" level to the transistor USWS. The transistor USWS is turned on by the signal of the "H" level. Accordingly, a source-side select gate line SGSx of the unselected/defective block BLK-u is electrically connected to the driver circuit 160 through the transistor USWS in the on-state and the wiring USGS. As a result, in the block BLK-u of the defective block, the USGS driver 61 of the driver circuit 160 applies the fixed voltage VSS to the source-side select gate line SGS-x. As described above, when the block BLK-u is the defective block, the unselected source-side select gate line SGS-x is set to be in the bias state in which a certain voltage (for example, the ground voltage) is applied.

As shown in FIG. 8, when the defective block information GOOD has a value ("H (1)") indicating that the corresponding block BLK is the non-defective block, the source-side unselect switch control circuit 52 supplies the signal BLKSELn_S of the "L" level to the transistor USWS. The transistor USWS is turned off by the signal of the "L" level. As a result, the source-side select gate line SGS-x of the block BLK-u is electrically disconnected from the wiring USGS by the transistor USWS in the off-state. As a result, when the block (unselected block) BLK-u is the non-defective block, the source-side select gate line SGS-x of the block BLKu is set to be in the electrically floating state.

The voltage of the source-side select gate line SGS-x rises to the voltage of the source line CELSRC by capacitive coupling. The capacitive coupling is caused by, for example, a load capacity (capacitive component), such as a capacitive component between the select gate line SGS-x and the contact LI and/or a capacitive component between the select gate line SGS-x and the conductive layer (source line SL).

As described above, in the present embodiment, the electrical state of the source-side select gate line SGS-x of the unselected/defective block BLK-u may be selectively set to be in any one of the floating state and the bias state in accordance with whether the block BLK-u is the non-defective block or the defective block.

Time t11

At time t11, the driver circuit 160 lowers the voltage of the selected drain-side select gate line SGD-s in the selected block BLK-s from the voltage V1 to the voltage V4. A voltage V4 is a voltage at which the drain-side select transistor ST1 (and the source-side select transistor ST2) is turned on. The driver circuit 160 lowers the voltage of the unselected drain-side select gate line SGD-u in the selected block BLK-s from the voltage V1 to the voltage VSS.

Time t12

At time t12, the driver circuit 160 raises the voltages of a select word line WL-s and an unselect word line WL-u of the selected block BLK-s. As a result, the voltage of the select word line WL-s and the voltage of the unselect word line WL-u rise to a voltage Vpass. The voltage Vpass is a voltage at which a channel is formed in a channel region (semiconductor layer 41) of the memory cell MC.

Time t13

At time t13, the driver circuit 160 raises the voltage of the select word line WL-s. The driver circuit 160 maintains the voltage of the unselect word line WL-u at the voltage Vpass.

The voltage of the select word line WL-s reaches a voltage V5. As a result, a program voltage VPGM1 is applied to the select word line WL-s. As a result, a threshold voltage of the memory cell MC that is the program target connected to the select word line WLs rises.

Time t14

At time t14, the driver circuit 160 lowers the voltage of the select word line WL-s from the voltage V5.

Time t15

At time t15, the driver circuit 160 lowers the voltage of the unselect word line WL-u from the voltage Vpass. The driver circuit 160 lowers the voltage of the selected drain-side select gate line SGD-s from the voltage V4. The driver circuit 160 lowers the voltage of the source line CELSRC from the voltage V2.

As a result, in the selected block BLK-s, the ground voltage VSS is applied to the select word line WL-s, the unselect word line WL-u, the selected drain-side select gate line SGDs, and the source line CELSRC.

The sense amplifier circuit 150 lowers the voltage of the bit line BL in the program prohibited state from the voltage V3 to the ground voltage VSS.

In the unselected block BLK, the voltage of the source-side select gate line SGS-x in the floating state is lowered in accordance with the decrease in the voltage of the source line CELSRC.

The program operation in a certain write loop of the write sequence ends by stopping the application of the program voltage VPGM1.

The sequencer 190 executes the program verify after the program operation in a certain write loop of the write sequence.

Time t20

At time t20, the sequencer 190 changes the signal level of the control signal USGS_GBFLT from the "H" level to the "L" level. During the period of the program verify, the signal level of the control signal USGS_GBFLT is maintained at the "L" level.

As a result, as shown in FIG. 8, in the source-side unselect switch control circuit 52 corresponding to the unselected/defective block BLK-u, the signal level of the control signal BLKSELn_S is set to the "H" level even when the defective block information GOOD is the "0" level or the "1" level. Accordingly, the transistor USWS is turned on in the switch circuit 142 corresponding to the unselected/defective block BLK-u. In the unselected/defective block BLK-u, the drain-side select gate line SGD-x and the source-side select gate line SGS-x are electrically connected to the driver circuit 160 through the transistors USWD and USWS in the on-state.

The driver circuit 160 raises the voltage of the select word line WL-s and the voltage of the unselect word line WL-u in the selected block BLK-s. The voltage VREAD is applied to the word lines WL-s and WL-u. The voltage VREAD is a voltage at which the memory cell MC is turned on without depending on data written into the memory cell MC.

The driver circuit 160 raises the voltage of the selected drain-side select gate line SGD-s and the unselected drain-side select gate line SGD-u in the selected block BLK-s. For example, the voltage V1 is applied to the drain-side select gate lines SGD-s and SGD-u.

The driver circuit 160 raises the voltage of the source-side select gate line SGS-s in the selected block BLK-s. For example, the voltage V1 is applied to the source-side select gate lines SGSs.

Time t21

The driver circuit 160 lowers the voltage of the select word line WL-s from the voltage VREAD to the ground voltage VSS. The driver circuit 160 lowers the voltage of the unselected drain-side select gate line SGD-u from the voltage V1 to the ground voltage VSS.

Time t22

At time t22, the sense amplifier circuit 150 raises the voltage of the bit line BL. A voltage V6 is applied to the bit line BL. For example, the voltage V6 is lower than the voltage V3.

The driver circuit 160 raises the voltage of the source line CELSRC. A voltage V7 is applied to the source line CELSRC. The voltage V7 is lower than the voltage V2. For example, the voltage V7 is lower than the voltage V6.

Regarding the unselected/defective block BLK-u, the driver circuit 160 raises the voltage of the unselected drain-side select gate line SGD-x from the ground voltage VSS to a voltage V8. For example, the voltage V8 is equal to the voltage V7.

The driver circuit 160 raises the voltage of the source-side select gate line SGS-x in the unselected/defective block BLK-u from the ground voltage VSS to a voltage V9, regardless of whether the unselected/defective block BLK-u is the non-defective block or the defective block. For example, the voltage V9 is equal to the voltage V7.

Regarding the selected block BLK-s, the driver circuit 160 applies a verify voltage Vvfy to the select word line WL-s. The driver circuit 160 maintains the voltage of the unselect word line WL-u at the voltage VREAD.

The verify voltage Vvfy includes one or more verify levels (voltage values) in accordance with the number of bits of data stored in the memory cell MC. When the memory cell MC stores 2-bit data, the verify voltage Vvfy includes three verify levels VAV, VBV, and VCV.

The driver circuit 160 raises the voltage of the select word line WL-s from the ground voltage VSS to the verify level VAV during the application period of the verify voltage Vvfy. As a result, a verification result in accordance with the on or off state of the memory cell MC is acquired with respect to the verify level VAV. After the application of the verify level VAV, the driver circuit 160 raises the voltage of the select word line WL-s from the verify level VAV to the verify level VBV. As a result, a verify result in accordance with the on or off of the memory cell MC is acquired with respect to the verify level VBV. After the application of the verify level VBV, the driver circuit 160 raises the voltage of the select word line WL-s from the verify level VBV to the verify level VCV. As a result, a verify result in accordance with the on or off of the memory cell MC is acquired with respect to the verify level VBV.

Time t23

At time t23, the driver circuit 160 lowers the voltages of each of the word lines WL-s and WL-u, each of the select gate lines SGD-s and SGS-s, and the source line CELSRC in the selected block BLK-s. As a result, the voltage VSS is applied to the voltages of each of the word lines WL-s and WL-u, each of the select gate lines SGD-s, SGD-u, and SGS-s, and the source line SL.

The driver circuit 160 lowers the voltage of each select gate line SGD-x and SGS-x in the unselected block BLK-u from the voltages V8 and V9 to the ground voltage VSS.

The sense amplifier circuit 150 lowers the voltage of the bit line BL from the voltage V6 to the ground voltage VSS.

The program verify in a certain write loop of the write sequence is ended by stopping the application of the verify voltage Vvfy.

Based on the verification result of each of the verify levels VAV, VBV, and VCV in the program verify, it is determined whether the write sequence is passed or failed. When the result of the program verify is a pass, the write sequence ends. When the result of the program verify is a fail, the write sequence is continued. When the write sequence is continued, the program operation in the next write loop is executed after the program verify in a certain write loop.

When the program operation in the next write loop is executed, the sequencer 190 changes the signal level of the control signal USGS_GBFLT from the "L" level to the "H" level as at time t10a.

The program operation of the next write loop is executed by substantially the same process as the process from the time t10 to the time t15 in the program operation of the previous write loop. A voltage V10 of a program voltage VPGM2 used for the program operation of the next write loop is higher than the voltage V5 of the program voltage VPGM1 used for the program operation of the previous write loop.

After the program operation by the program voltage VPGM2, the program verify of the next write loop is executed. The program verify of the next write loop is executed by substantially the same process as the process from the time t20 to the time t23 in the program verify of the previous write loop.

As described above, when it is determined that the write sequence is passed based on the result of the program verify by the execution of one or more write loops, in the memory device 1 according to the present embodiment, the write sequence ends.

It should be noted that, when the signal level of the control signal USGS_GBFLT is set to the "L" level in both the program operation and the program verify of the write sequence, the signal level of the control signal BLKSELn_S control signal BLKSELn_D) in the unselected/defective block BLK-u is set to the "H" level even when the defective block information GOOD is the "H" level or the "L" level. In this case, the voltage of the source-side select gate line SGS-x and the voltage of the drain-side select gate line SGD-x of the unselected block BLK-u are controlled by the control signals BLKSELn_S and BLKSELn_D of the "H" level, and the voltage supplied from the driver circuit 160.

The read sequence of the memory device 1 according to the present embodiment is executed by a well-known technique. In the read sequence of the memory device 1 according to the present embodiment, the signal level of the control signal USGS_GBFLT is set to the "L" level.

As described above, in the present embodiment, for example, when the write sequence is in the program operation, the electrical state of the source-side select gate line SGS-x of the unselected/defective block BLK-u is set independently from the drain-side select gate line SGD-x in accordance with whether the unselected/defective block BLK-u is the non-defective block or the defective block.

(1c) Summary

The NAND flash memory includes the memory cell array in which the memory cells are stacked in three dimensions.

In a manufacturing process of the NAND flash memory, a block having a stacked structure may be collapsed due to dust or the collapse of a high-layered pattern.

In order to improve the manufacturing yield of the NAND flash memory, it is desirable to set the collapsed block as the defective block and to ship the NAND flash memory as a good-quality chip without setting the collapsed block as a chip of a defective product even when the collapsed block is generated.

In addition, it is desirable that the reliability of the NAND flash memory is ensured even when the NAND flash memory includes the collapsed block.

For example, a current flowing from the bit line to the source line in the unselected block may be generated. In the collapsed block, the current flowing from the bit line to the source line tends to increase.

When the generation of the current between the bit line and the source line in the collapsed block is prevented, the NAND flash memory including the collapsed block need not be regarded as a defective product.

As a unit configured to prevent the generation of current between the bit line and the source line, a voltage having a certain magnitude is applied to the source-side select gate line of the unselected block, so that the source-side select transistor is set to be in the off-state.

In all the unselected blocks (and the defective blocks), when a voltage is applied to the source-side select gate line, a large load capacity is generated in the vicinity of the source-side select gate line of each unselected block when the program voltage is applied in the write sequence. Due to the increase in the load capacity in the vicinity of the source-side select gate line in the bias state, an increase in the power consumption of the NAND flash memory or an increase in the time of the write sequence may occur.

As described above, the memory device 1 according to the present embodiment controls the electrical state (bias state) of the source-side select gate line SGS in the unselected block BLK-u by using the defective block information GOOD.

As a result, in the memory device 1 according to the present embodiment, the presence or absence of the bias with respect to the source-side select gate line SGS-x of a plurality of unselected blocks BLK-u can be selectively set in accordance with whether the unselected block is the defective block or the non-defective block.

Therefore, in the memory device 1 according to the present embodiment, a voltage having a certain magnitude can be applied only to the source-side select gate line SGS-x in the defective block based on the defective block information GOOD.

Therefore, the memory device 1 according to the present embodiment can prevent the increase in the load capacity caused by the source-side select gate line SGS-x in the bias state in the unselected block BLK-u. As a result, the memory device 1 according to the present embodiment can prevent the increase in the consumption current and the increase in the time of the write sequence.

As described above, the memory device 1 according to the present embodiment can improve the characteristics of the memory device. The memory device 1 according to the present embodiment can improve the manufacturing yield the memory device.

(2) Second Embodiment

A memory device 1 and a control method of the memory device 1 according to a second embodiment will be described with reference to FIGS. 13 to 16.

(2a) Configuration Example

Figure 13:
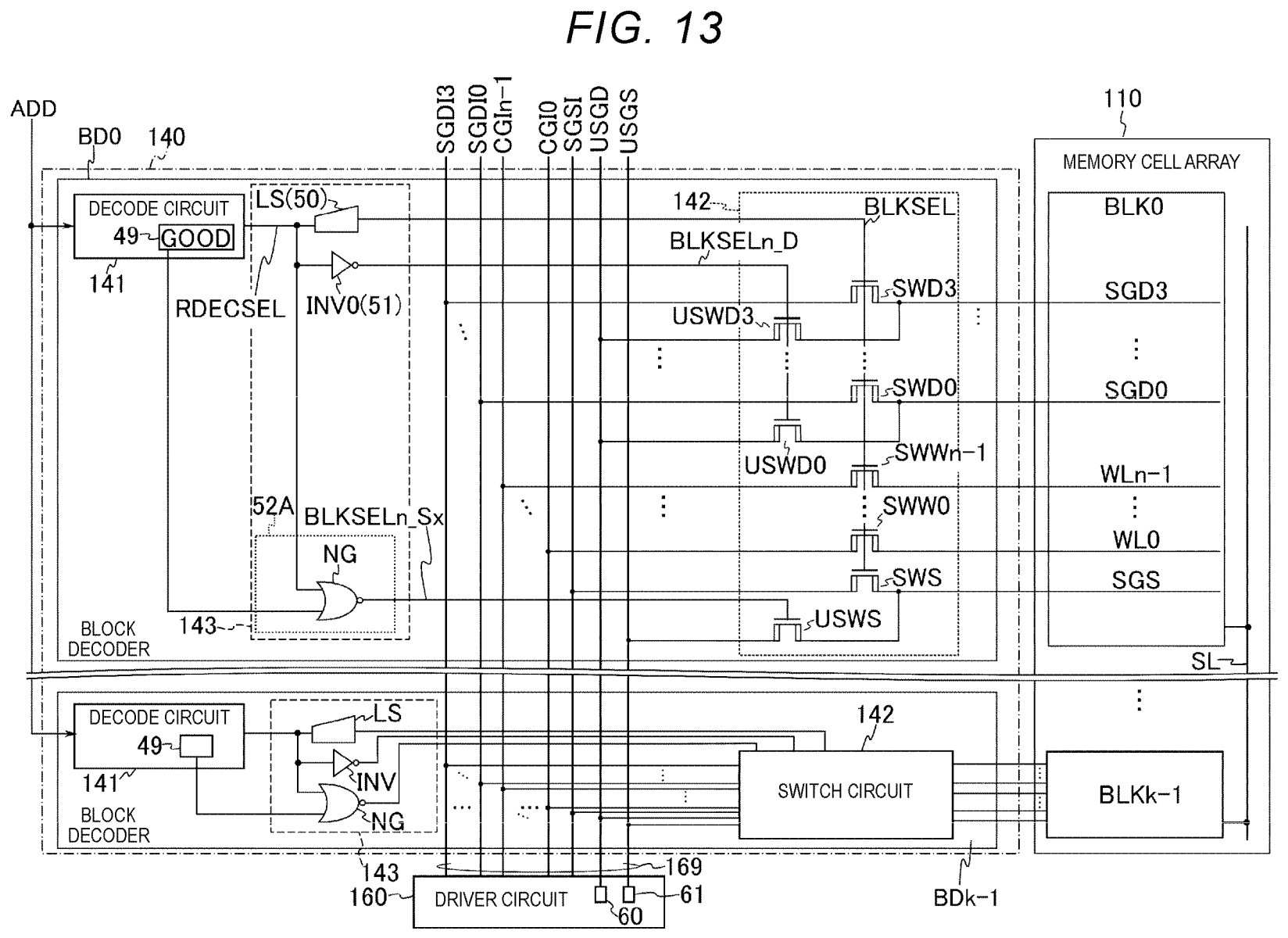

FIG. 13 is a diagram showing a circuit configuration of the row control circuit 140 in the memory device 1 according to the present embodiment.

As shown in FIG. 13, in the present embodiment, a source-side unselect switch control circuit 52A includes one NOR gate NG.

One input terminal of the NOR gate NG is connected to the output node of the decode circuit 141. The other input terminal of the NOR gate NG is connected to the defective block information latch 49. The output node of the NOR gate NG is connected to the gate of the transistor USWS.

The NOR gate NG receives the control signal (defective block information) GOOD and the control signal RDEC-SEL. The NOR gate NG supplies a control signal BLKSELn_Sx in accordance with the result of the NOR operation with respect to the defective block information GOOD and the control signal RDECSEL to the gate of the transistor USWS.

The transistor USWS is turned on or off in accordance with the signal level of the signal BLKSELn_Sx. When the signal level of the signal BLKSELn_Sx is the "H" level, the transistor USWS is turned on. Accordingly, the source-side select gate line SGS receives the voltage from the USGS driver 61 through the transistor USWS in the on-state. When the signal level of the signal BLKSELn_Sx is the "L" level, the transistor USWS is turned off. Accordingly, the source-side select gate line SGS is electrically disconnected from the USGS driver 61 by the transistor USWS in the off-state.

In the present embodiment, the control signal USGS_GBFLT is not used to control the electrical state of the source-side select gate line SGS. The signal line for supplying the control signal USGS_GBFLT to a plurality of source-side unselect switch control circuits 52A is not provided.

Figure 14:
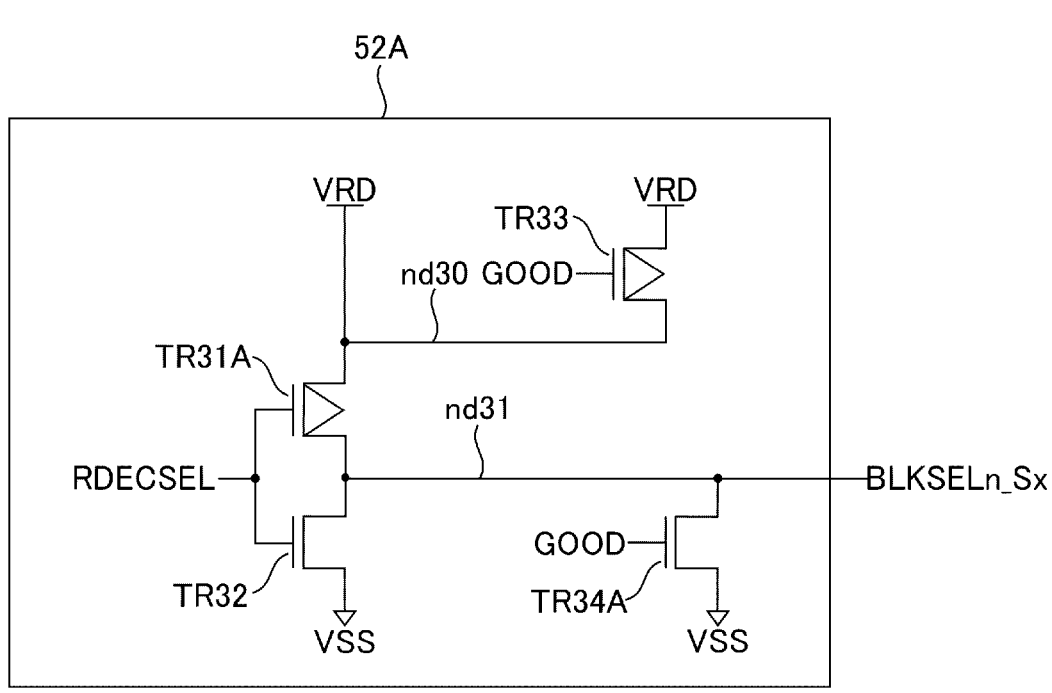
FIG. 14 is a circuit diagram showing a configuration example of a switch control circuit of the memory device according to the second embodiment.

FIG. 14 is a circuit diagram showing a configuration example of the source-side unselect switch control circuit 52A in the memory device 1 according to the present embodiment.

As shown in FIG. 14, in the present embodiment, the source-side unselect switch control circuit 52A includes four transistors TR31A, TR32, TR33, and TR34.

One end of the current path of the transistor TR31A is connected to the power terminal VRD through the node nd30. The other end of the current path of the transistor TR31 is connected to one end of the current path of the transistor TR32 through the node nd31. The gate of the transistor TR31A is connected to the gate of the transistor TR32. The control signal RDECSEL is supplied to the gate of the transistor TR31A.

One end of the current path of the transistor TR34A is connected to the node nd31. The other end of the current path of the transistor TR34A is connected to the ground terminal VSS. The defective block information GOOD is supplied to the gate of the transistor TR34A.

For example, when the defective block information GOOD is the "H" level and the control signal RDECSEL is the "L" level, the control signal BLKSELn_Sx of the "L" level is output from the node nd31. For example, when the defective block information GOOD is the "L" level and the control signal RDECSEL is the "L" level, the control signal BLKSELn_Sx of the "H" level is output from the node nd31.

FIG. 15 is a diagram showing an operation state of the source-side unselect switch control circuit 52A in the memory device 1 according to the present embodiment. FIG. 15 shows a case where the memory device 1 according to the present embodiment is controlled in accordance with the defective block information GOOD. That is, the signal level of the control signal ROMBAEN is set to the "L" level.

As shown in FIG. 15, when in the corresponding block BLK, the signal level of the defective block information GOOD is at the "0" level and the signal level of the control signal RDECSEL is at the "0" level, the signal level of the control signal BLKSELn_Sx is at the "1" level. As described above, when the corresponding block BLK is the defective block and/or the unselected block BLK-u, the source-side unselect switch control circuit 52A sets the transistor USWS to be in the on-state by the signal of the "1" level. Accordingly, the voltage from the USGS driver 61 is applied to the unselected source-side select gate line SGS-x.

When in the corresponding block BLK, the signal level of the defective block information GOOD is at the "1" level and the signal level of the control signal RDECSEL is at the "0" level, the signal level of the control signal BLKSELn_Sx is at the "0" level. As described above, when the corresponding block BLK is the non-defective block and/or the unselected block, the source-side unselect control circuit 52A sets the transistor USWS to be in the off-state by the signal of the "0" level. Accordingly, the unselected source-side select gate line SGS-x is set to be in the electrically floating state.

In the corresponding block BLK, when the signal level of the control signal RDECSEL is the "1" level, the signal level of the control signal BLKSELn_Sx is the "0" level even when the defective block information GOOD is the "0" level or the "1" level. As described above, when the corresponding block is the selected block BLK-s, the source-side unselect switch control circuit 52A sets the transistor USWS to be in the off-state by the control signal BLKSELn_Sx of the "0" level. The USGS driver 61 is electrically disconnected from the source-side select gate line SGS-s of the selected block BLK.

As described above, the electrical state of the source-side select gate line SGS of the block BLK may be controlled based on the defective block information GOOD and the control signal RDECSEL.

When an operation mode for controlling the source-side select gate line SGS by the signal, such as the control signal USGS_GBFLT, is not switched, the source-side unselect switch control circuit 52A may include only one NOR gate NG as in the present embodiment.

(2b) Operation Example

An operation example (control method) of the memory device 1 according to the present embodiment will be described with reference to FIG. 16.

Figure 16:
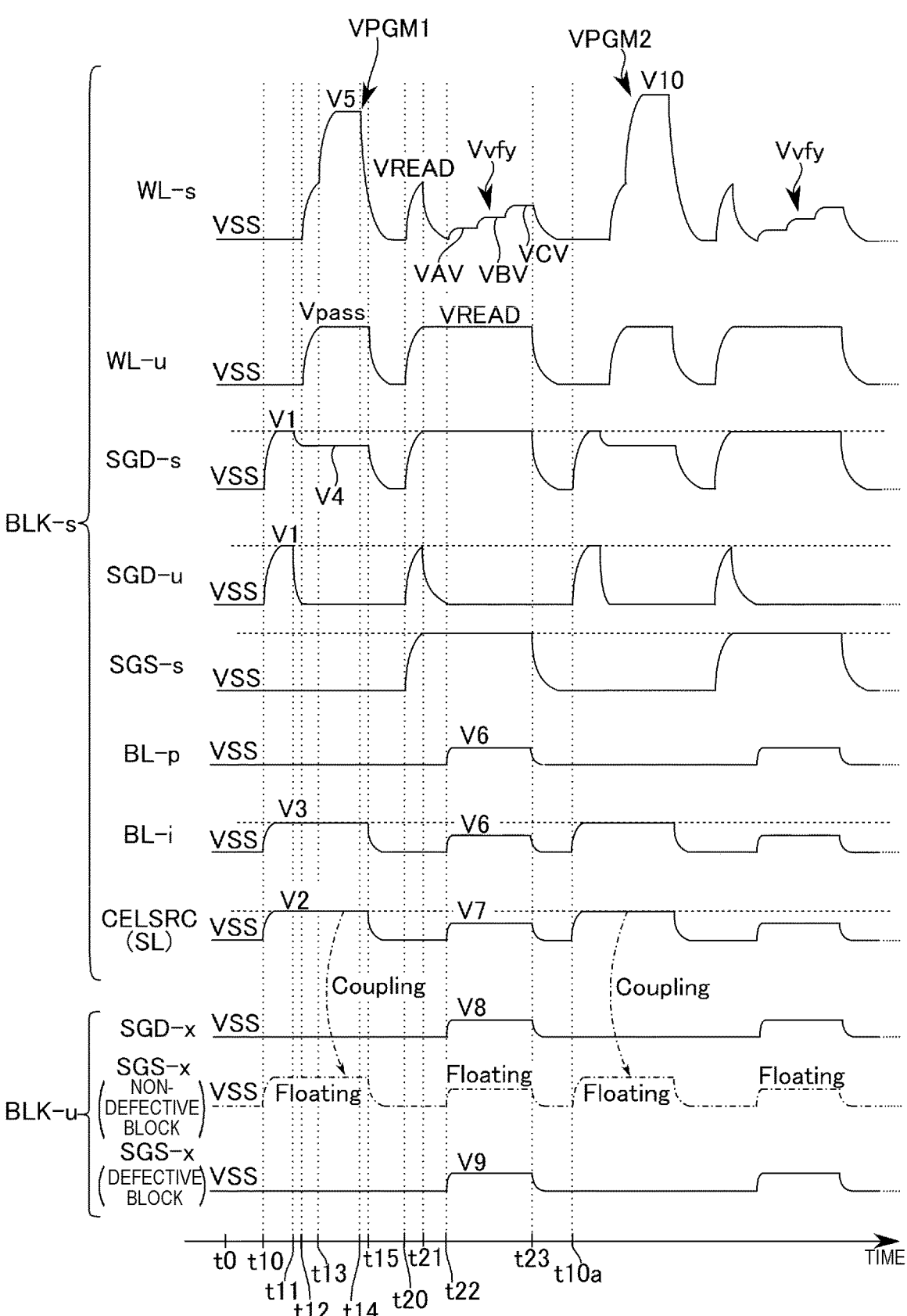
FIG. 16 is a timing chart showing an operation example of the memory device according to the second embodiment.

FIG. 16 is a timing chart showing the operation example of the memory device 1 according to the present embodiment. In FIG. 16, the write sequence of the memory device 1 according to the present embodiment is shown.

As described above, in the present embodiment, when the corresponding block BLK is the non-defective block and the unselected block BLK-u, the source-side unselect switch control circuit 52A sets the transistor USWS to be in the off-state by the control signal BLKSELn_Sx of the "L" level.

As a result, as shown in FIG. 16, the unselected source-side select gate line SGS-x of the unselected non-defective block BLK-u is set to be in the electrically floating state during the write sequence.

Therefore, the voltage of the source-side select gate line SGS-x fluctuates in accordance with the voltage of the source line CELSRC by the coupling of the source-side select gate line SGS-x and the source line CELSRC (SL).

When the corresponding block BLK is the defective block and the unselected block BLK-u, the source-side unselect switch control circuit 52A sets the transistor USWS to be in the on-state by the control signal BLKSELn_Sx of the "H" level.

As a result, as shown in FIG. 16, the unselected source-side select gate line SGS-x of the unselected defective block BLK-u is biased by the ground voltage VSS in the write sequence.

(2c) Summary

In the present embodiment, the source-side unselect switch control circuit 52A of the row control circuit 140 includes only the NOR gate NG. Therefore, the source-side unselect switch control circuit 52A can reduce the number of elements and reduce a circuit area. As described above, the memory device 1 according to the present embodiment can easily implement the circuit.

In the present embodiment, when the corresponding block BLK is the non-defective block, the source-side unselect switch control circuit 52A corresponding to the unselected block BLK-u sets the unselected source-side select gate line SGS-x to be in the electrically floating state without controlling the voltage of the unselected source-side select gate line SGS-x. When the corresponding block BLK is the defective block, the source-side unselect switch control circuit 52A corresponding to the unselected block BLK-u controls the voltage of the unselected source-side select gate line SGS-x.

Accordingly, the memory device 1 according to the present embodiment can accelerate the charging of the source line CELSRC.

In the present embodiment, the electrical state of the source-side select gate line SGSx of the unselected block BLK-u is controlled based only on the defective block information GOOD. Therefore, in the present embodiment, the timing of charging and discharging of the source-side select gate line SGS-x of the unselected block BLK-u need not be controlled. Therefore, in the memory device 1 according to the present embodiment, the load for controlling the source-side select gate line SGS is reduced.

As described above, the memory device according to the present embodiment can obtain substantially the same effects as the effects of the above-described embodiment.

(3) Third Embodiment

A memory device 1 and a control method of the memory device 1 according to a third embodiment will be described with reference to FIG. 17.

In the present embodiment, the driver for the unselected drain-side select gate line SGD is integrated with the driver for the unselected source-side select gate line SGS.

Figure 17:
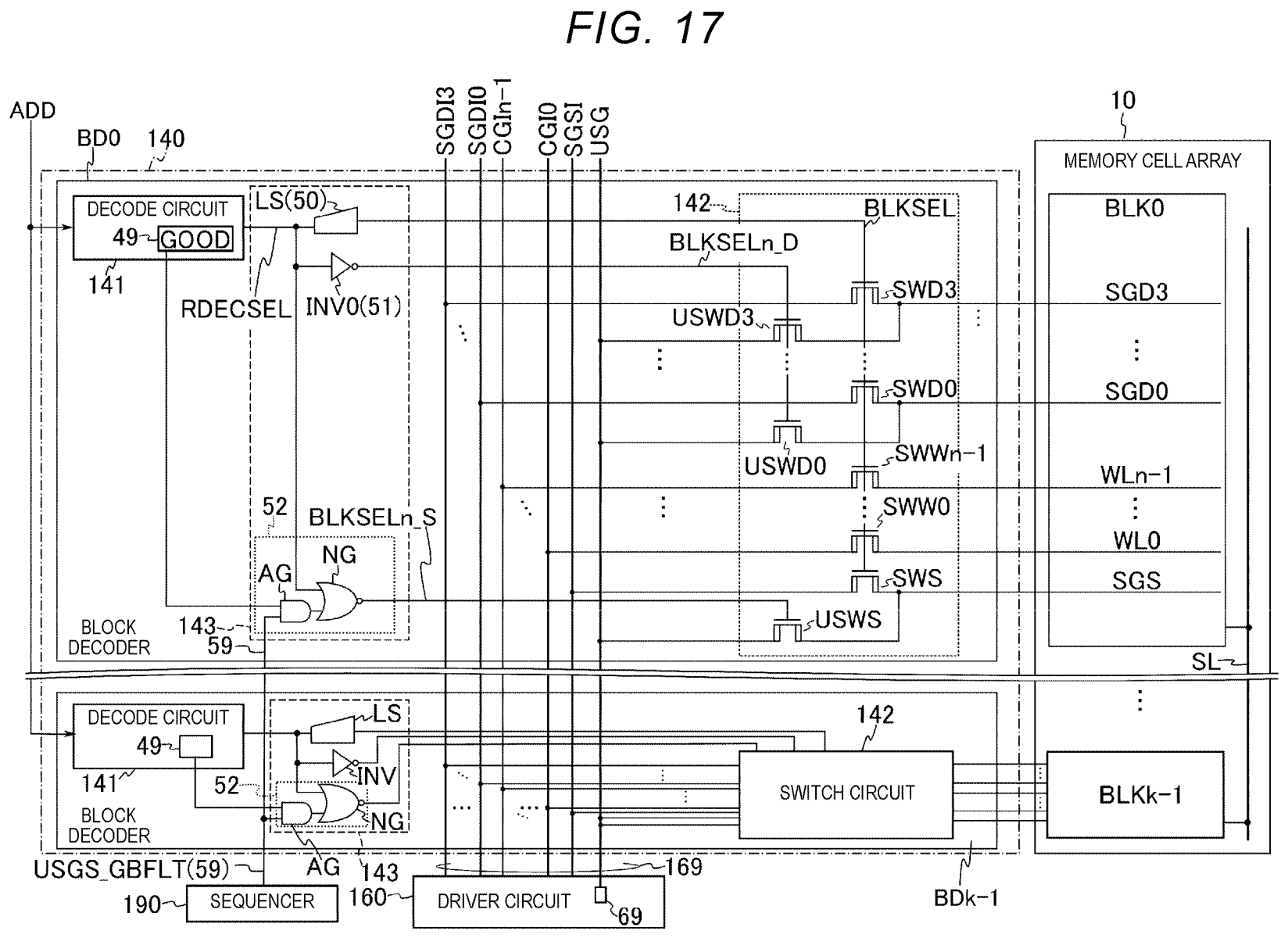

As shown in FIG. 17, the driver circuit 160 includes a driver 69. The driver 69 is connected to a wiring USG of the wiring group 169.

One end of the current path of the transistor USWD is connected to the drain-side select gate line SGD, and the other end of the current path of the transistor USWD is connected to the wiring USG.

One end of the current path of the transistor USWS is connected to the source-side select gate line SGS, and the other end of the current path of the transistor USWS is connected to the wiring USG.

In the present embodiment, the plurality of transistors USWD and USWS, which are unselect switches of the select gate lines SGD and SGS, are connected to one driver 69 through the common wiring USG. As described above, the driver for the drain-side select gate line SGD and the driver for the source-side select gate line SGS are integrated into one driver.

Accordingly, in the unselected block BLK-u, the common voltage is applied to the drain-side select gate line SGD-x and the source-side select gate line SGS-x.

As a result, in the memory device 1 according to the present embodiment, the number of drivers that apply the voltage to the drain-side and source-side select gate lines SGD and SGS of the unselected block BLK can be reduced.

Therefore, the memory device 1 according to the present embodiment can reduce a circuit scale of the memory device 1. As a result, in the memory device 1 according to the present embodiment, for example, a chip size of the memory device 1 can be reduced.

In addition, the memory device 1 according to the present embodiment can obtain the effects of the above-described other embodiments.

(4) Others

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A memory device comprising:
   a memory cell array including a block including:
   a first transistor connected to a first select gate line,
   a second transistor connected to a second select gate line, and
   a plurality of memory cells connected in series between the first transistor and the second transistor and each connected to one corresponding word line of a plurality of word lines; and
   a row control circuit configured to:
   output a first control signal for setting the block to be in a selected state or an unselected state based on a result of decoding an address,
   store information indicating whether the block is a non-defective block or a defective block, and
   control an electrical state of the second select gate line independently of the first select gate line based on the first control signal and the information;

wherein when the block is set to be in the unselected state by the first control signal and the information indicates that the block is the non-defective block, the row control circuit sets the second select gate line to be in an electrically floating state, and when the block is set to be in the unselected state by the first control signal and the information indicates that the block is the defective block, the row control circuit sets the second select gate line to be in an electrically bias state.

2. The memory device according to claim 1, wherein when the block is set to be in the unselected state by the first control signal and the information indicates that the block is the non-defective block, the row control circuit sets the first select gate line to be in an electrically bias state.

3. The memory device according to claim 1, wherein a ground voltage is applied to the second select gate line set to be in the bias state.

4. The memory device according to claim 1, wherein the row control circuit is configured to receive a second control signal for controlling a state of a voltage of the second select gate line, when a signal level of the second control signal is a first level, the row control circuit is configured to set the second select gate line to be in an electrically bias state when the block is controlled to be in the unselected state by the first control signal, and when the signal level of the second control signal is a second level, the row control circuit:

sets the second select gate line to be in an electrically floating state when the block is set to be in the unselected state by the first control signal and the information indicates that the block is the non-defective block, and sets the second select gate line to be in the electrically bias state when the block is set to be in the unselected state by the first control signal and the information indicates that the block is the defective block.

5. The memory device according to claim 4, wherein when the block is set to be in the unselected state by the first control signal and the information indicates that the block is the non-defective block, the row control circuit sets the first select gate line to be in an electrically bias state.

6. The memory device according to claim 4, wherein a ground voltage is applied to the second select gate line set to be in the bias state.

7. The memory device according to claim 1, further comprising:

a driver circuit configured to output a plurality of voltages to be applied to the first select gate line, the second select gate line, and the plurality of word lines, wherein the row control circuit includes:

a decode circuit configured to generate the first control signal, a latch circuit configured to store the information, a switch circuit configured to electrically connect or disconnect the block and the driver circuit, and a switch control circuit configured to control the switch circuit, and the switch control circuit is configured to control the electrical connection or disconnection between the driver circuit and the second select gate line by the switch circuit, based on the first control signal and the information.

8. The memory device according to claim 7, wherein the switch control circuit includes:

a NOR gate including a first input node configured to receive the first control signal, a second input node configured to receive the information, and a first output node configured to output a first signal indicating a result of a logical NOR operation between the first control signal and the information.

9. The memory device according to claim 8, wherein the switch circuit includes: a first switch including:

a first terminal connected to the first select gate line, a second terminal connected to the driver circuit, and a first gate configured to receive an inverted signal of the first control signal, and a second switch including:

a third terminal connected to the second select gate line, a fourth terminal connected to the driver circuit, and a second gate configured to receive the first signal.

10. The memory device according to claim 9, wherein the driver circuit includes a driver configured to output a voltage to the first select gate line and the second select gate line of the block in the unselected state, and the second and fourth terminals are connected to the driver through a wiring.

11. The memory device according to claim 7, wherein the switch control circuit includes:

a first P-type transistor including:

a first terminal connected to a first power terminal, a second terminal connected to a first node configured to transfer a signal to the switch circuit, and a first gate configured to receive the first control signal, a first N-type transistor including a third terminal connected to the first node, a fourth terminal connected to a second power terminal, and a second gate configured to receive the first control signal, a second P-type transistor including a fifth terminal connected to the first power terminal, a sixth terminal connected to the first terminal, and a third gate configured to receive the information, and a second N-type transistor including a seventh terminal connected to the first node, an eighth terminal connected to the second power terminal, and a fourth gate configured to receive the information.

12. The memory device according to claim 7, wherein the row control circuit is configured to receive a second control signal for controlling a state of a voltage of the second select gate line, the switch control circuit includes:

an AND gate including a first input node configured to receive the information, a second input node configured to receive the second control signal, and a first output node configured to output a first signal indicating a result of a logical AND between the information and the second control signal, and a NOR gate including a third input node configured to receive the first control signal, a fourth input node configured to receive the first signal, and a second output node configured to output a second signal indicating a result of a logical NOR between the first control signal and the first signal.

13. The memory device according to claim 12,
wherein the switch circuit includes:
    a first switch including:
        a first terminal connected to the first select gate line,
        a second terminal connected to the driver circuit, and
        a first gate configured to receive an inverted signal of the first control signal, and
    a second switch including:
        a third terminal connected to the second select gate line,
        a fourth terminal connected to the driver circuit, and
        a second gate configured to receive the second signal.

14. The memory device according to claim 13,
wherein the driver circuit includes a driver configured to output a voltage to the first select gate line and the second select gate line of the block in the unselected state, and
the second and fourth terminals are connected to the driver through a wiring.

15. The memory device according to claim 7,
wherein the row control circuit is configured to receive a second control signal for controlling a state of a voltage of the second select gate line, and
the row control circuit includes:
    a first P-type transistor including a first terminal connected to a first power terminal, a second terminal connected to a first node, and a first gate configured to receive the second control signal,
    a second P-type transistor including a third terminal connected to the first node, a fourth terminal connected to a second node for transferring a signal to the switch circuit, and a second gate configured to receive the first control signal,
    a first N-type transistor including a fifth terminal connected to the second node, a sixth terminal connected to a second power terminal, and a third gate configured to receive the first control signal,
    a third P-type transistor including a seventh terminal connected to the first power terminal, an eighth terminal connected to the first node, and a fourth gate configured to receive the information,
    a second N-type transistor including a ninth terminal connected to the second node, a tenth terminal, and a fifth gate configured to receive the information, and
    a third N-type transistor including an eleventh terminal connected to the tenth terminal, a twelfth terminal connected to the second power terminal, and a sixth gate configured to receive the second control signal.

16. The memory device according to claim 1,
wherein each of the plurality of memory cells includes:
    a semiconductor layer extending in a first direction perpendicular to a surface of a substrate,
    a first conductive layer facing the semiconductor layer in a second direction parallel to the surface of the substrate,
    a first insulating layer between the first conductive layer and the semiconductor layer,
    a second insulating layer between the first conductive layer and the first insulating layer, and
    a charge storage layer between the first insulating layer and the second insulating layer.

17. A memory device comprising:
a memory cell array including a block including:
    a first transistor connected to a first select gate line,
    a second transistor connected to a second select gate line, and
    a plurality of memory cells connected in series between the first transistor and the second transistor and each connected to one corresponding word line of a plurality of word lines; and
a row control circuit including:
    a first control circuit configured to control an electrical state of the first select gate line based on a first control signal for setting the block to be in a selected state or an unselected state, and
    a second control circuit configured to control an electrical state of the second select gate line based on the first control signal and information indicating whether the block is a non-defective block or a defective block;
wherein the row control circuit is configured to receive a second control signal for controlling a state of a voltage of the second select gate line, and
the row control circuit includes:
    a first P-type transistor including a first terminal connected to a first power terminal,
    a second terminal connected to a first node, and
    a first gate configured to receive the second control signal,
    a second P-type transistor including a third terminal connected to the first node, a fourth terminal connected to a second node for transferring a signal to the switch circuit, and a second gate configured to receive the first control signal,
    a first N-type transistor including a fifth terminal connected to the second node, a sixth terminal connected to a second power terminal, and a third gate configured to receive the first control signal,
    a third P-type transistor including a seventh terminal connected to the first power terminal, an eighth terminal connected to the first node, and a fourth gate configured to receive the information,
    a second N-type transistor including a ninth terminal connected to the second node, a tenth terminal, and a fifth gate configured to receive the information, and
    a third N-type transistor including an eleventh terminal connected to the tenth terminal, a twelfth terminal connected to the second power terminal, and a sixth gate configured to receive the second control signal.

18. The memory device according to claim 17, further comprising:
a driver circuit configured to output a plurality of voltages to be applied to the first select gate line, the second select gate line, and the plurality of word lines,
wherein the row control circuit includes:
    a decode circuit configured to generate the first control signal,
    a latch circuit configured to store the information,
    a switch circuit configured to electrically connect or disconnect the block and the driver circuit, and
    a switch control circuit configured to control the switch circuit, and
the switch control circuit is configured to control the electrical connection or disconnection between the driver circuit and the second select gate line by the switch circuit, based on the first control signal and the information.

* * * * *